United States Patent
Shenoy

(10) Patent No.: US 7,936,008 B2
(45) Date of Patent: May 3, 2011

(54) STRUCTURE AND METHOD FOR FORMING ACCUMULATION-MODE FIELD EFFECT TRANSISTOR WITH IMPROVED CURRENT CAPABILITY

(75) Inventor: Praveen Muraleedharan Shenoy, Wilkes Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 182 days.

(21) Appl. No.: 12/114,575

(22) Filed: May 2, 2008

(65) Prior Publication Data

US 2008/0211012 A1    Sep. 4, 2008

Related U.S. Application Data

(63) Continuation of application No. 11/140,249, filed on May 26, 2005, now Pat. No. 7,368,777, which is a continuation-in-part of application No. 11/026,276, filed on Dec. 29, 2004, now Pat. No. 7,345,342.

(60) Provisional application No. 60/588,845, filed on Jul. 15, 2004, provisional application No. 60/669,063, filed on Apr. 6, 2005.

(51) Int. Cl.
  *H01L 27/108* (2006.01)
  *H01L 29/76* (2006.01)
(52) U.S. Cl. ........ 257/330; 257/328; 257/332; 257/341; 257/E21.252; 257/E1.345; 257/E29.02; 257/E29.257; 438/259; 438/270; 438/274
(58) Field of Classification Search .................. 257/328, 257/330, 332, 341, E21.252, E21.345, E29.02, 257/E29.257; 438/259, 270, 274
See application file for complete search history.

(56) References Cited

U.S. PATENT DOCUMENTS

| | | | |
|---|---|---|---|
| 3,404,295 | A | 10/1968 | Warner et al. |
| 3,412,297 | A | 11/1968 | Amlinger |
| 3,497,777 | A | 2/1970 | Teszner et al. |
| 3,564,356 | A | 2/1971 | Wilson |
| 3,660,697 | A | 5/1972 | Berglund et al. |
| 4,003,072 | A | 1/1977 | Matsushita et al. |

(Continued)

FOREIGN PATENT DOCUMENTS

CN    1036666 A    10/1989

(Continued)

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

(Continued)

*Primary Examiner* — Dao H Nguyen
(74) *Attorney, Agent, or Firm* — Kilpatrick Townsend & Stockton

(57) ABSTRACT

An accumulation-mode field effect transistor includes a drift region of a first conductivity type, channel regions of the first conductivity type over and in contact with the drift region, and gate trenches having sidewalls abutting the channel regions. The gate trenches extend into and terminate within the drift region. The transistor further includes a first plurality of silicon regions of a second conductivity type forming P-N junctions with the channel regions along vertical walls of the first plurality of silicon regions. The first plurality of silicon regions extend into the drift region and form P-N junctions with the drift region along bottoms of the first plurality of silicon regions.

20 Claims, 12 Drawing Sheets

U.S. PATENT DOCUMENTS

| | | | |
|---|---|---|---|
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney |
| 4,337,474 A | 6/1982 | Yukimoto |
| 4,345,265 A | 8/1982 | Blanchard |
| 4,445,202 A | 4/1984 | Goetze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,903,189 A | 2/1990 | Ngo et al. |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,323,040 A | 6/1994 | Baliga |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A * | 12/1996 | Ajit .............................. 257/331 |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,856,692 A | 1/1999 | Williams et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |

| | | | | | | |
|---|---|---|---|---|---|---|
| 5,981,344 | A | 11/1999 | Hshieh et al. | 6,313,482 B1 | 11/2001 | Baliga |
| 5,981,996 | A | 11/1999 | Fujishima | 6,316,806 B1 | 11/2001 | Mo |
| 5,998,833 | A | 12/1999 | Baliga | 6,326,656 B1 | 12/2001 | Tihanyi |
| 6,005,271 | A | 12/1999 | Hshieh | 6,337,499 B1 | 1/2002 | Werner |
| 6,008,097 | A | 12/1999 | Yoon et al. | 6,346,464 B1 | 2/2002 | Takeda et al. |
| 6,011,298 | A | 1/2000 | Blanchard | 6,346,469 B1 | 2/2002 | Greer |
| 6,015,727 | A | 1/2000 | Wanlass | 6,351,018 B1 | 2/2002 | Sapp |
| 6,020,250 | A | 2/2000 | Kenney | 6,353,252 B1 | 3/2002 | Yasuhara et al. |
| 6,034,415 | A | 3/2000 | Johnson et al. | 6,359,308 B1 | 3/2002 | Hijzen et al. |
| 6,037,202 | A | 3/2000 | Witek | 6,362,112 B1 | 3/2002 | Hamerski |
| 6,037,628 | A | 3/2000 | Huang | 6,362,505 B1 | 3/2002 | Tihanyi |
| 6,037,632 | A | 3/2000 | Omura et al. | 6,365,462 B2 | 4/2002 | Baliga |
| 6,040,600 | A | 3/2000 | Uenishi et al. | 6,365,930 B1 | 4/2002 | Schillaci et al. |
| 6,048,772 | A | 4/2000 | D'Anna | 6,368,920 B1 | 4/2002 | Beasom |
| 6,049,108 | A | 4/2000 | Williams et al. | 6,368,921 B1 | 4/2002 | Hijzen et al. |
| 6,051,488 | A | 4/2000 | Lee et al. | 6,376,314 B1 | 4/2002 | Jerred |
| 6,057,558 | A | 5/2000 | Yamamoto et al. | 6,376,315 B1 | 4/2002 | Hshieh et al. |
| 6,063,678 | A | 5/2000 | D'Anna | 6,376,878 B1 | 4/2002 | Kocon |
| 6,064,088 | A | 5/2000 | D'Anna | 6,376,890 B1 | 4/2002 | Tihanyi |
| 6,066,878 | A | 5/2000 | Neilson | 6,384,456 B1 | 5/2002 | Tihanyi |
| 6,069,043 | A | 5/2000 | Floyd et al. | 6,388,286 B1 | 5/2002 | Baliga |
| 6,077,733 | A | 6/2000 | Chen et al. | 6,388,287 B2 | 5/2002 | Deboy et al. |
| 6,081,009 | A | 6/2000 | Neilson | 6,400,003 B1 | 6/2002 | Huang |
| 6,084,264 | A | 7/2000 | Darwish | 6,426,260 B1 | 7/2002 | Hshieh |
| 6,084,268 | A | 7/2000 | de Frésart et al. | 6,429,481 B1 | 8/2002 | Mo et al. |
| 6,087,232 | A | 7/2000 | Kim et al. | 6,433,385 B1 | 8/2002 | Kocon et al. |
| 6,096,608 | A | 8/2000 | Williams | 6,436,779 B2 | 8/2002 | Hurkx et al. |
| 6,097,063 | A | 8/2000 | Fujihira | 6,437,399 B1 | 8/2002 | Huang |
| 6,103,578 | A | 8/2000 | Uenishi et al. | 6,441,454 B2 | 8/2002 | Hijzen et al. |
| 6,103,619 | A | 8/2000 | Lai | 6,444,574 B1 | 9/2002 | Chu |
| 6,104,054 | A | 8/2000 | Corsi et al. | 6,452,230 B1 | 9/2002 | Boden, Jr. |
| 6,110,799 | A | 8/2000 | Huang | 6,461,918 B1 | 10/2002 | Calafut |
| 6,114,727 | A | 9/2000 | Ogura et al. | 6,465,304 B1 | 10/2002 | Blanchard et al. |
| 6,137,152 | A | 10/2000 | Wu | 6,465,843 B1 | 10/2002 | Hirler et al. |
| 6,150,697 | A | 11/2000 | Teshigahara et al. | 6,465,869 B2 | 10/2002 | Ahlers et al. |
| 6,156,606 | A | 12/2000 | Michaelis | 6,472,678 B1 | 10/2002 | Hshieh et al. |
| 6,156,611 | A | 12/2000 | Lan et al. | 6,472,708 B1 | 10/2002 | Hshieh et al. |
| 6,163,052 | A | 12/2000 | Liu et al. | 6,475,884 B2 | 11/2002 | Hshieh et al. |
| 6,165,870 | A | 12/2000 | Shim et al. | 6,476,443 B1 | 11/2002 | Kinzer |
| 6,168,983 | B1 | 1/2001 | Rumennik et al. | 6,479,352 B2 | 11/2002 | Blanchard |
| 6,168,996 | B1 | 1/2001 | Numazawa et al. | 6,489,652 B1 | 12/2002 | Jeon et al. |
| 6,171,935 | B1 | 1/2001 | Nance et al. | 6,501,146 B1 | 12/2002 | Harada |
| 6,174,769 | B1 | 1/2001 | Lou | 6,534,825 B2 | 3/2003 | Calafut |
| 6,174,773 | B1 | 1/2001 | Fujishima | 6,566,804 B1 | 5/2003 | Trujillo et al. |
| 6,174,785 | B1 | 1/2001 | Parekh et al. | 6,580,123 B2 | 6/2003 | Thapar |
| 6,184,545 | B1 | 2/2001 | Werner et al. | 6,608,350 B2 | 8/2003 | Kinzer et al. |
| 6,184,555 | B1 | 2/2001 | Tihanyi et al. | 6,657,254 B2 | 12/2003 | Hshieh et al. |
| 6,188,104 | B1 | 2/2001 | Choi et al. | 6,677,641 B2 | 1/2004 | Kocon |
| 6,188,105 | B1 | 2/2001 | Kocon et al. | 6,683,346 B2 | 1/2004 | Zeng |
| 6,190,978 | B1 | 2/2001 | D'Anna | 6,720,616 B2 | 4/2004 | Hirler et al. |
| 6,191,447 | B1 | 2/2001 | Baliga | 6,734,066 B2 | 5/2004 | Lin et al. |
| 6,194,741 | B1 | 2/2001 | Kinzer et al. | 6,750,506 B2 | 6/2004 | Noda et al. |
| 6,198,127 | B1 | 3/2001 | Kocon | 6,762,127 B2 | 7/2004 | Boiteux et al. |
| 6,201,279 | B1 | 3/2001 | Pfirsch | 6,806,533 B2 | 10/2004 | Henninger et al. |
| 6,204,097 | B1 | 3/2001 | Shen et al. | 6,833,584 B2 | 12/2004 | Henninger et al. |
| 6,207,994 | B1 | 3/2001 | Rumennik et al. | 7,368,777 B2 | 5/2008 | Kocon |
| 6,222,229 | B1 | 4/2001 | Hebert et al. | 7,638,841 B2 * | 12/2009 | Challa .......................... 257/341 |
| 6,222,233 | B1 | 4/2001 | D'Anna | 2001/0023961 A1 | 9/2001 | Hsieh et al. |
| 6,225,649 | B1 | 5/2001 | Minato | 2001/0026989 A1 | 10/2001 | Thapar |
| 6,228,727 | B1 | 5/2001 | Lim et al. | 2001/0028083 A1 | 10/2001 | Onishi et al. |
| 6,239,463 | B1 | 5/2001 | Williams et al. | 2001/0032998 A1 | 10/2001 | Iwamoto et al. |
| 6,239,464 | B1 | 5/2001 | Tsuchitani et al. | 2001/0041400 A1 | 11/2001 | Ren et al. |
| 6,265,269 | B1 | 7/2001 | Chen et al. | 2001/0049167 A1 | 12/2001 | Madson |
| 6,271,082 | B1 | 8/2001 | Hou et al. | 2001/0050394 A1 | 12/2001 | Onishi et al. |
| 6,271,100 | B1 | 8/2001 | Ballantine et al. | 2002/0008284 A1 | 1/2002 | Zeng |
| 6,271,552 | B1 | 8/2001 | D'Anna | 2002/0009832 A1 | 1/2002 | Blanchard |
| 6,271,562 | B1 | 8/2001 | Deboy et al. | 2002/0014658 A1 | 2/2002 | Blanchard |
| 6,274,904 | B1 | 8/2001 | Tihanyi | 2002/0027237 A1 | 3/2002 | Onishi et al. |
| 6,274,905 | B1 | 8/2001 | Mo | 2002/0066924 A1 | 6/2002 | Blanchard |
| 6,277,706 | B1 | 8/2001 | Ishikawa | 2002/0070418 A1 | 6/2002 | Kinzer et al. |
| 6,281,547 | B1 | 8/2001 | So et al. | 2003/0060013 A1 | 3/2003 | Marchant |
| 6,285,060 | B1 | 9/2001 | Korec et al. | 2003/0100933 A1 | 5/2003 | Ayal et al. |
| 6,291,298 | B1 | 9/2001 | Williams et al. | 2003/0132450 A1 | 7/2003 | Minato et al. |
| 6,291,856 | B1 | 9/2001 | Miyasaka et al. | 2003/0193067 A1 | 10/2003 | Kim |
| 6,294,818 | B1 | 9/2001 | Fujihira | 2003/0207536 A1 | 11/2003 | Miyasaka et al. |
| 6,297,534 | B1 | 10/2001 | Kawaguchi et al. | 2003/0209757 A1 | 11/2003 | Henninger et al. |
| 6,303,969 | B1 | 10/2001 | Tan | 2004/0016959 A1 | 1/2004 | Yamaguchi et al. |
| 6,307,246 | B1 | 10/2001 | Nitta et al. | 2004/0031987 A1 | 2/2004 | Henninger et al. |
| 6,309,920 | B1 | 10/2001 | Laska et al. | 2004/0089910 A1 | 5/2004 | Hirler et al. |

| | | | |
|---|---|---|---|
| 2004/0121572 | A1 | 6/2004 | Darwish et al. |
| 2004/0232407 | A1 | 11/2004 | Calafut |
| 2005/0017293 | A1 | 1/2005 | Zundel et al. |

FOREIGN PATENT DOCUMENTS

| | | | |
|---|---|---|---|
| DE | 4300806 C1 | 12/1993 | |
| DE | 19736981 A1 | 8/1998 | |
| EP | 0020164 A1 | 12/1980 | |
| EP | 0975024 A2 | 1/2000 | |
| EP | 1026749 A1 | 8/2000 | |
| EP | 1054451 A2 | 11/2000 | |
| EP | 1111683 A2 | 6/2001 | |
| EP | 0747967 B1 | 2/2002 | |
| EP | 1205980 A1 | 5/2002 | |
| JP | 56-058267 A | 5/1981 | |
| JP | 62-069562 | 3/1987 | |
| JP | 62173764 A | 7/1987 | |
| JP | 63-186475 | 8/1988 | |
| JP | 63-288047 | 11/1988 | |
| JP | 63296282 A | 12/1988 | |
| JP | 64-022051 | 1/1989 | |
| JP | 01-192174 A | 8/1989 | |
| JP | 05-226638 A | 9/1993 | |
| JP | 9191109 A | 7/1997 | |
| JP | 2000-040822 | 2/2000 | |
| JP | 2000-040872 | 2/2000 | |
| JP | 2000-156978 A | 6/2000 | |
| JP | 2000-277726 A | 10/2000 | |
| JP | 2000-277728 A | 10/2000 | |
| JP | 2001-015448 | 1/2001 | |
| JP | 2001-015752 | 1/2001 | |
| JP | 2001-102577 A | 4/2001 | |
| JP | 2001-111041 A | 4/2001 | |
| JP | 2001-135819 A | 5/2001 | |
| JP | 2001-144292 A | 5/2001 | |
| JP | 2001237423 A | 8/2001 | |
| JP | 2001-244461 A | 9/2001 | |
| JP | 2001-313391 A | 12/2001 | |
| JP | 2002-083976 A | 3/2002 | |
| JP | 2002525872 T | 8/2002 | |
| JP | 2002531952 A | 9/2002 | |
| JP | 2002299622 A | 10/2002 | |
| WO | WO 00/17931 A1 | 3/2000 | |
| WO | WO 00/33386 A2 | 6/2000 | |
| WO | WO 00/68997 A1 | 11/2000 | |
| WO | WO 00/68998 A1 | 11/2000 | |
| WO | WO 00/75965 A2 | 12/2000 | |
| WO | WO 01/06550 A1 | 1/2001 | |
| WO | WO 01/06557 A1 | 1/2001 | |
| WO | WO 01/45155 A1 | 6/2001 | |
| WO | WO 01/59847 A2 | 8/2001 | |
| WO | WO 01/71815 | 9/2001 | |
| WO | WO 01/88997 A2 | 11/2001 | |
| WO | WO 01/95385 A1 | 12/2001 | |
| WO | WO 01/95398 A1 | 12/2001 | |
| WO | WO 02/01644 A2 | 1/2002 | |
| WO | WO 02/47171 A1 | 6/2002 | |

OTHER PUBLICATIONS

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics-May 2003 Proceedings (PCIM), Nurenburg, vol. 47, pp. 275-278.

Bulucea "Trench DMOS Transistor Technology for High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm$^2$," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance.ISPSD Proceedings-Apr. 2003, Cambridge, 4 pages total.

Djekic, O. et al., "High frequency synchronous buck converter for low voltage applications," (1998) *Proc. IEEE Power Electronics Specialist Conf. (PESC)*, pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD May 22-25, 2000, Toulouse France, pp. 197-200.

"IR develops CoolMOS™ -equivalent technology, positions it at the top of a 3-tiered line of new products for SMPS," International Rectifiers company information available at http://www.irf.com (1999) 3 pages total.

Kao et al.,"Two Dimensional Thermal Oxidation of Silicon-I. Experiments,", *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with intergrated schottky diode,"(1989) *Proc. IEEE Power Electronics Specialist Conf. (PESC)*, pp. 176-179.

Lorenz et al., "COOL MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Management & Supply—Market, Applications Technologies—an Overview," Infineon Technologies, downloaded from the Internet <<http://www.ewh.ieee.org/r8/germany/ias-pels/m_regensburg/overview_millerpdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1998) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf et al., "Silicon Processing for the VLSI Era" vol. 1—Process Technology, Second Edition, (1990), pp. 658.

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

\* cited by examiner

STRUCTURE AND METHOD FOR FORMING ACCUMULATION-MODE FIELD EFFECT TRANSISTOR WITH IMPROVED CURRENT CAPABILITY

CROSS-REFERENCES TO RELATED APPLICATIONS

This is a continuation of U.S. application Ser. No. 11/140,249, filed May 26, 2005, which claims the benefit of U.S. Provisional Application No. 60/588,845, filed Jul. 15, 2004, and U.S. Provisional Application No. 60/669,063, filed Apr. 6, 2005, which are commonly assigned and incorporated herein by reference in their entirety for all purposes. Also, U.S. application Ser. No. 11/140,249 is a continuation-in-part of U.S. patent application Ser. No. 11/026,276, filed Dec. 29, 2004, which is commonly assigned and incorporated herein by reference in its entirety for all purposes.

BACKGROUND OF THE INVENTION

The present invention relates in general to the semiconductor technology and more particularly to semiconductor accumulation-mode power devices with charge balance structures integrated therein.

FIG. 1 shows a cross section view of a conventional trenched-gate accumulation-mode vertical MOSFET 100. MOSFET 100 is an n-channel transistor with a gate terminal formed inside each of trenches 102, n-type regions 112 between trenches 102 (hereinafter referred to as the channel regions), a drift region 106, and an n-type drain region 114. Unlike enhancement-mode transistors, accumulation-mode transistor 100 does not include a blocking (p-type in this example) well or body region inside which the conduction channel is formed. Instead a conducting channel is formed when an accumulation layer is formed in channel regions 112. Transistor 100 is normally on or off depending on doping concentration of channel regions 112 and doping type of the gate electrodes. It is turned off when channel regions 112 are entirely depleted and lightly inverted. Because no inversion channel is formed, the channel resistance is eliminated thus improving the transistor power handling capability and its efficiency. Further, with no pn body diode, the losses in synchronous rectification circuits attributable to the pn diode are eliminated.

A drawback of accumulation transistor 100 is that drift region 106 needs to be lightly doped to support a high enough reverse bias voltage. However, a lightly doped drift region results in a lower on-resistance and lower efficiency. Thus, there is a need for an accumulation-mode transistor with low on-resistance, high blocking capability, and improved efficiency.

BRIEF SUMMARY OF THE INVENTION

In accordance with an embodiment of the present invention, an accumulation-mode field effect transistor includes a drift region of a first conductivity type, channel regions of the first conductivity type over and in contact with the drift region, and gate trenches having sidewalls abutting the channel regions. The gate trenches extend into and terminate within the drift region. The transistor further includes a first plurality of silicon regions of a second conductivity type forming P-N junctions with the channel regions along vertical walls of the first plurality of silicon regions. The first plurality of silicon regions extend into the drift region and form P-N junctions with the drift region along bottoms of the first plurality of silicon regions.

In one embodiment, conduction channels are formed in the channel regions along the sidewalls of the gate trenches when the accumulation-mode field effect transistor is in the on state.

In another embodiment, the transistor further includes a substrate of the first conductivity type and an epitaxial layer of the first conductivity type over the substrate, where the epitaxial layer has a lower doping concentration than the substrate, and the channel regions, the first plurality of silicon regions, and the gate trenches are formed in the epitaxial layer. Also, a portion of the epitaxial layer bounded by the substrate and the bottom surfaces of the channel regions, gate trenches, and the first plurality of silicon regions forms the drift region.

In yet another embodiment, the transistor further includes a second plurality of silicon regions of the first conductivity type in the channel regions. The second plurality of silicon regions flanks the gate trenches, and have a higher doping concentration than that of the channel regions. In one variation, a resistor is coupled between the first plurality of silicon regions and the second plurality of silicon regions.

In still another embodiment, the drift region includes alternating columns of first and second conductivity type silicon, and when the accumulation-mode field effect transistor is in an on state, a current flows through the columns of first conductivity type but not through the columns of the second conductivity type.

In accordance with another embodiment of the invention, a method of forming an accumulation-mode field effect transistor includes the following steps. A channel region of a first conductivity type is formed in a semiconductor region of the first conductivity type, where the channel region extends from a top surface of the semiconductor region to a first depth within the semiconductor region. Gate trenches are formed in the semiconductor region, where the gate trenches extend from the top surface of the semiconductor region to a second depth within the semiconductor region below the first depth. A first plurality of silicon regions of a second conductivity type are formed in the semiconductor region such that the first plurality of silicon regions form P-N junctions with the channel region along vertical walls of the first plurality of silicon regions.

In one embodiment, the first plurality of silicon regions and the gate trenches are alternately arranged so that each of the first plurality of silicon regions is between but laterally spaced from two adjacent gate trenches.

In another embodiment, the first plurality of silicon regions are formed by first forming body trenches in the semiconductor region, where the body trenches extend from the top surface of the semiconductor region to a depth within the semiconductor region below the first depth. The body trenches are then substantially filled with silicon material of the second conductivity type. The body trenches and the gate trenches are alternately arranged so that each body trench is between but laterally spaced from two adjacent gate trenches.

In another embodiment, the first plurality of silicon regions are formed by implanting dopants of the second conductivity type into the semiconductor region.

In yet another embodiment, the semiconductor region includes an epitaxial layer extending over and in contact with a substrate, where the substrate and the epitaxial layer are of the first conductivity type and the epitaxial layer has a lower doping concentration than the substrate. The channel region, the trenches and the first plurality of silicon regions extend into the epitaxial layer.

In yet another embodiment, a second plurality of silicon regions of the first conductivity type are formed in the channel region such that each pair of the second plurality of silicon regions flanks sides of a corresponding one of the gate trenches, where the second plurality of silicon regions have a higher doping concentration than that of the channel region.

In still another embodiment, columns of silicon of the second conductivity type are formed in the semiconductor region so that the columns of silicon of the second conductivity type and the semiconductor region together form alternating columns of first and second conductivity type silicon. No current flows through the columns of silicon of the second conductivity type when the accumulation-mode field effect transistor is in the on state.

These and other embodiments of the invention will be described with reference to the accompanying drawings and following detailed description.

DETAILED DESCRIPTION OF THE INVENTION

In accordance with the present invention, charge spreading techniques are advantageously integrated in vertical and lateral accumulation-mode power devices to achieve lower on-resistance, higher blocking capability and improved efficiency.

Figure 1:
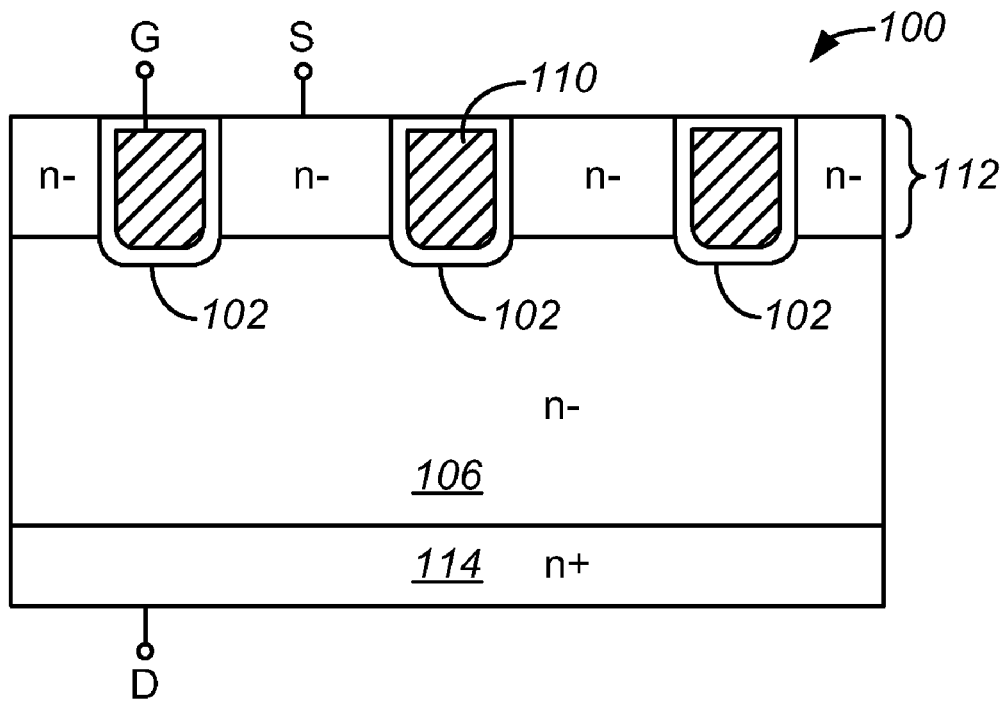
FIG. 1 shows a cross section view of a conventional trenched-gate accumulation-mode vertical field effect transistor.
Figure 2:
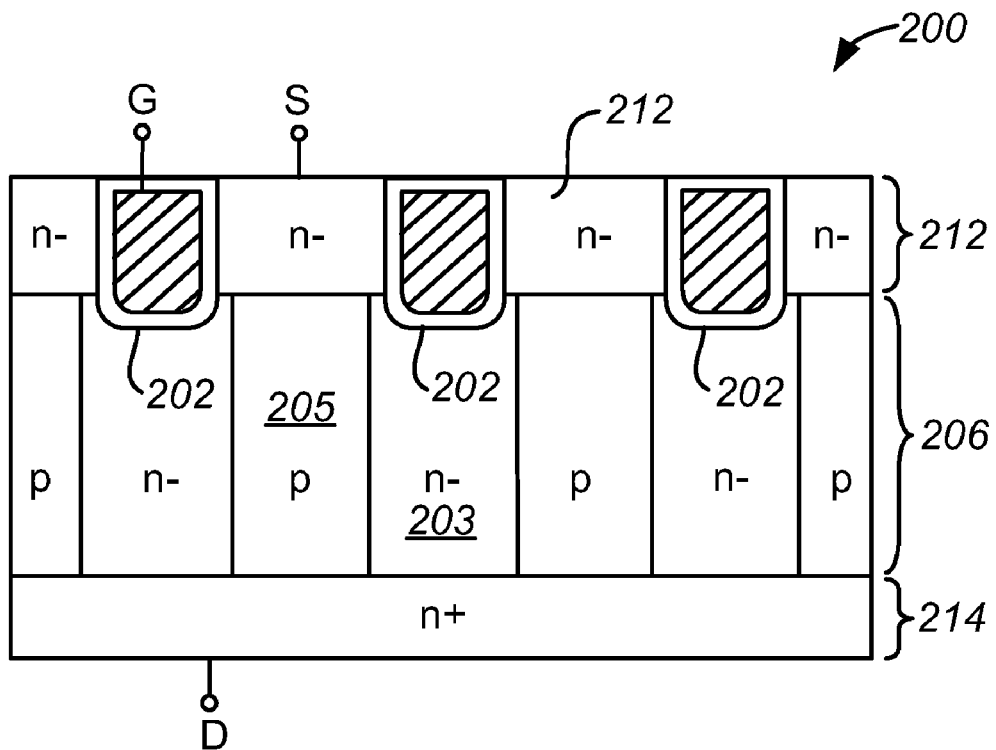
FIG. 2 shows a cross section view of an exemplary trenched-gate accumulation-mode vertical field effect transistor with alternate conductivity type regions in accordance with an embodiment of the invention.

FIG. 2 shows a simplified cross section view of an exemplary accumulation-mode field effect transistor 200 with alternate conductivity regions 203, 205 extending vertically parallel to the current flow. In this example, transistor 200 is an n-channel transistor with a gate terminal formed inside each of trenches 202, n-type channel regions 212 between trenches 202, a drift region 206 that includes opposite polarity columnar n-type and p-type sections 203 and 205, and an n-type drain region 214. Unlike enhancement-mode transistors, accumulation-mode transistor 200 does not include a blocking (p-type in this example) well or body region inside which the conduction channel is formed. Instead a conducting channel is formed when an accumulation layer is formed in channel regions 212. Transistor 200 is normally on or off depending on doping concentration of channel regions 212 and doping type of the gate electrodes. It is turned off when channel regions 212 are entirely depleted and lightly inverted.

In the embodiments describe herein, those portions of the drift region through which current flows when the transistor is in an on state are referred to as the conduction regions.

The doping concentrations in opposite polarity regions 203 and 205 are adjusted to maximize charge spreading, which enables the transistor to support higher voltages and also results in more efficient use of the silicon. The use of columnar opposite polarity regions parallel to the current flow flattens the electric field distribution in the conduction regions by not allowing it to decrease linearly away from the junction formed between regions 212 and 206. The charge spreading effect of this structure allows the use of a more highly doped drift region 206 which advantageously reduces transistor on-resistance. The doping concentration of the various regions may vary; for example, n-type regions 212 and 203 may have the same or different doping concentrations. The embodiment wherein n-type regions 212 and 203 have the same doping concentration is simpler to manufacture and thus less costly, and is attractive for use in low voltage applications. Those skilled in the art appreciate that an improved p-channel transistor can be obtained by reversing the polarities of the various regions of the transistor shown in FIG. 2.

An exemplary method of forming the accumulation-mode transistor in FIG. 2 is as follows. An n-type epitaxial layer is formed over substrate 214 in accordance with conventional methods. Using a masking layer, columns of silicon are removed from the epitaxial layer using conventional silicon etching techniques. Silicon material 205 of p-type conductivity is then formed in the removed columns of silicon using known techniques. An n-type epitaxial layer 212 is then formed over epitaxial layer 206 using conventional techniques. Trenched gate structures are then formed in epitaxial layer 212 using known methods.

Figure 3:
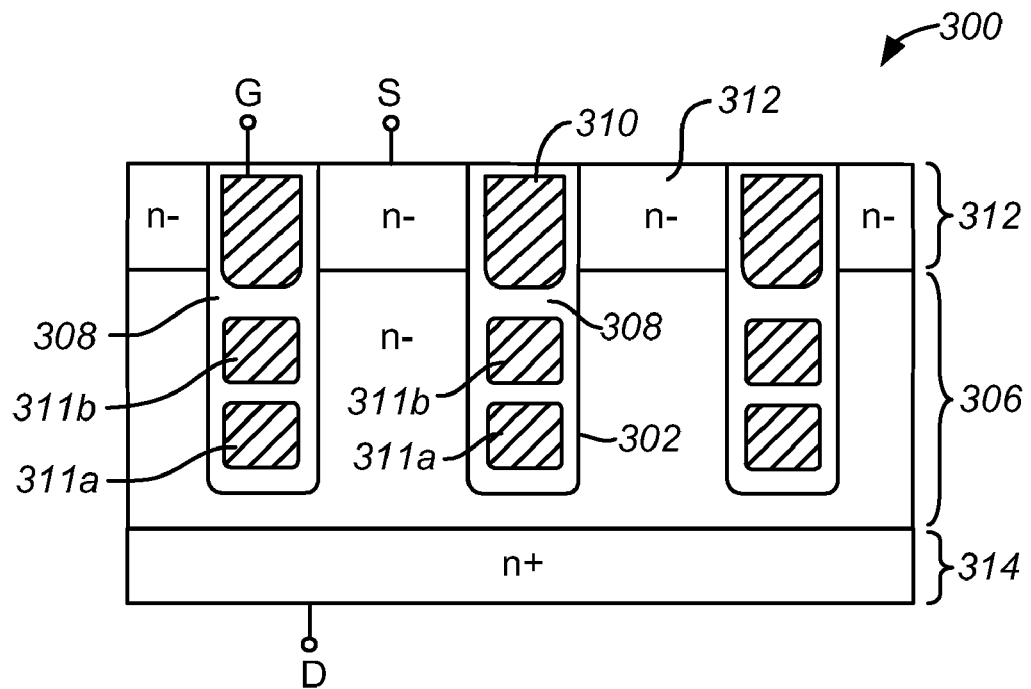
FIGS. 3 and 4 show cross section views of two exemplary trenched-gate accumulation-mode vertical field effect transistors with trenched electrodes in accordance with other embodiments of the invention.
Figure 4:
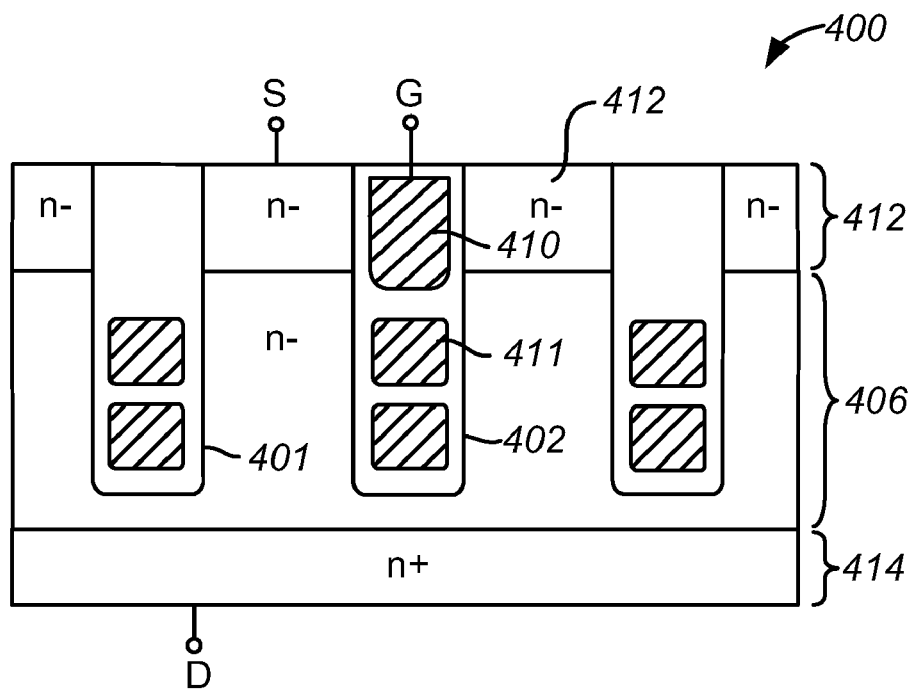

FIG. 3 is a simplified cross section view of another accumulation-mode field effect transistor 300 with trenched electrodes for charge spreading purposes. Channel regions 312, drift region 306 and drain region 314 are all of the same conductivity type which in this example is n-type. The doping concentration of channel regions 312 is adjusted to form a depleted blocking junction under no bias conditions. Inside each trench 302, one or more buried electrodes 311 are formed under gate electrode 310, all insulated from one another and from drift region 306 by dielectric material 308. Buried electrodes 311 act as field plates and can be biased, if desired, to a potential that optimizes their charge spreading effect. Since charge spreading can be controlled by independently biasing buried electrodes 311, the maximum electric field can be increased significantly. Different variations of this structure are possible. For example, the depth of trench 302 and the size and number of buried electrodes 311 can vary depending on the application. Charge spreading electrodes can be buried inside trenches that are separate from active trenches that house the transistor gate electrode. An example of such an embodiment is shown in FIG. 4.

A method of forming the structure in FIG. 3 is as follows. An n-type epitaxial layer is formed over substrate 314. An n-type layer 312 is formed along an upper portion of the epitaxial layer by implanting dopants into the epitaxial layer. Depending on the desired doping concentration, n-type dopants may be implanted into the epitaxial layer so that n-type layer 312 has a higher doping concentration than drift region 306 of the epitaxial layer, or alternatively, p-type counter-dopants may be implanted into the epitaxial layer so that n-type layer 312 has a lower doping concentration than drift region 306 of the epitaxial layer. In another embodiment, regions 306 and 312 are formed by growing two n-type epitaxial layers having different doping concentrations. An exemplary set of process steps for forming the trenched electrodes are described in the above-referenced commonly assigned U.S. patent application Ser. No. 10/821,796 titled "Schottky Diode Using Charge Balance Structure," filed Apr. 9, 2004, incorporated herein by reference in its entirety. The trenched-gate structures are formed using conventional techniques.

Figure 5:
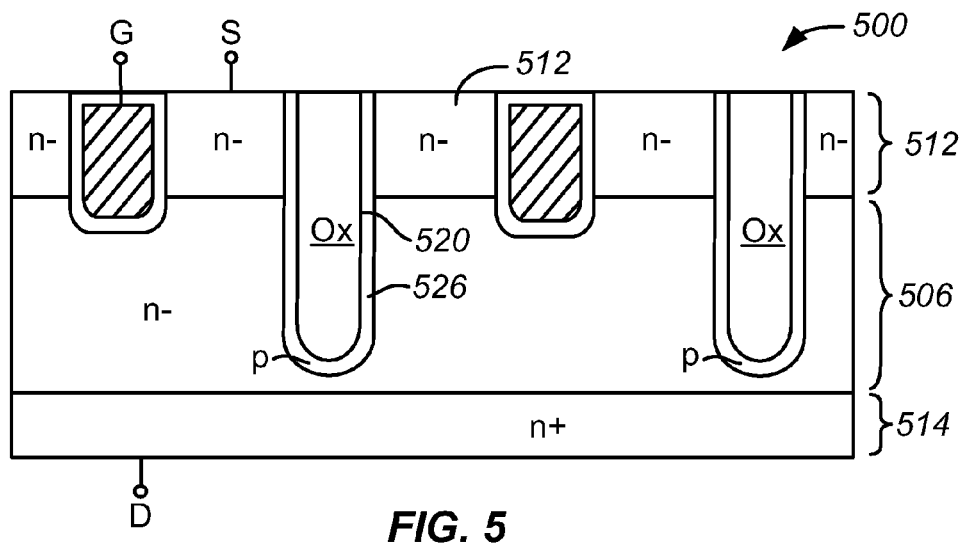
FIGS. 5 and 6 are cross section views of two exemplary trenched-gate accumulation-mode vertical field effect transistors with dielectric-filled trenches in accordance with other embodiments of the invention.

Another embodiment for an improved accumulation-mode transistor employs dielectric-filled trenches with an opposite polarity exterior liner. FIG. 5 is a simplified cross section view of an accumulation transistor 500 according to this embodiment. Dielectric-filled trenches 520 extend downward from the surface of the silicon well into drift region 506. Trenches 520 are substantially filled with dielectric material such as silicon dioxide. In this exemplary embodiment, transistor 500 is an n-channel transistor with trenched-gate structure. A p-type region 526 lines the exterior sidewalls and bottom of dielectric-filled trenches 520 as shown. Dielectric-filled trenches 520 reduce the output capacitance of the transistor while p-type liner 526 provides for charge balancing in the drift region to increase the blocking capability of the transistor. In one exemplary method of forming transistor 500, regions 506 and 512 are formed in a similar manner to previous embodiments. A set of process steps for forming the dielectric-filled trenches is disclosed in the above-referenced commonly assigned U.S. Pat. No. 6,376,878 to Christopher B. Kocon, titled "MOS-Gated Devices with Alternating Zones of Conductivity," incorporated herein in its entirety. The trenched-gate structures are formed using conventional techniques.

Figure 6:
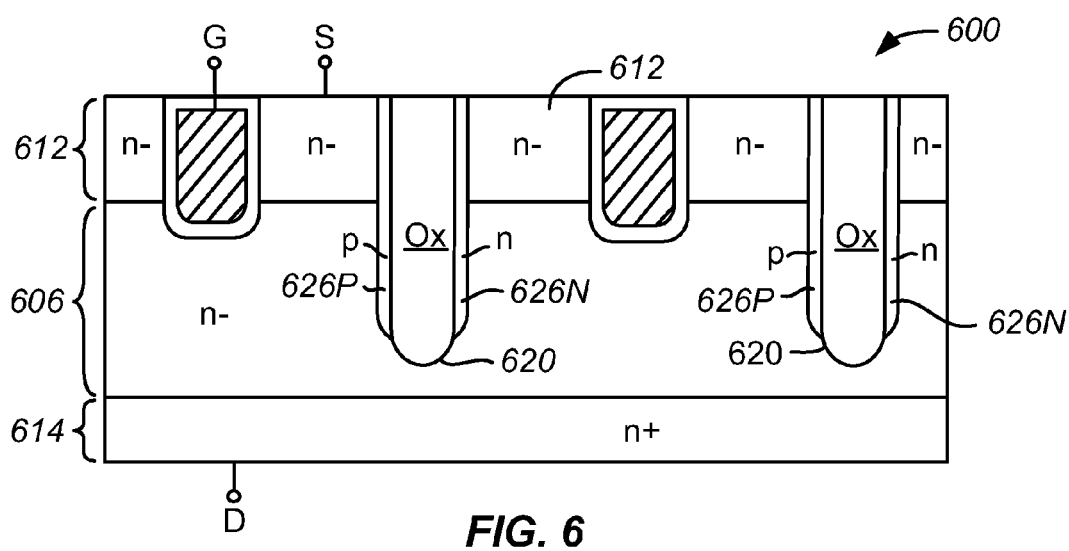

In an alternative embodiment shown in FIG. 6, oppositely doped liners 626N and 626P are formed adjacent the opposite sidewalls of a dielectric-filled trench 620. That is, a dielectric-filled trench 620 has a p-type liner 626P extending along the exterior sidewall on one side, and an n-type liner 626N extending along the exterior sidewall on the opposite side of the same trench. Other variations of this accumulation transistor with dielectric-filled trenches are possible. These include, for example, an accumulation transistor with a planar (as opposed to trenched) gate structure; an accumulation transistor with a p-type liner that covers only the exterior sidewalls and not the bottom of trenches 526; and an accumulation transistor with a single trench structure with a p-type liner that lines the lower portion of the trench.

Figure 7:
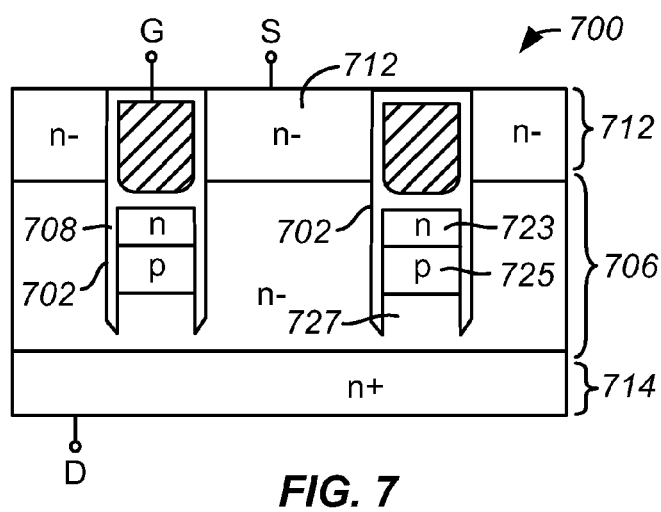
FIGS. 7 and 8 show cross section views of two exemplary trenched-gate accumulation-mode vertical field effect transistors with trenched diodes in accordance with other embodiments of the invention.

In another embodiment, an accumulation-mode transistor employs one or more diodes stacked inside a trench for charge balancing purposes. A simplified cross section view of an exemplary accumulation-mode transistor 700 according to this embodiment is shown in FIG. 7. In this embodiment, the charge balancing diodes are formed inside the same trench as the gate. Trench 702 includes gate electrode 710 below which n-type 723 and p-type 725 silicon or doped polysilicon layers form pn junctions. A dielectric layer 708 separates the diode structure from gate terminal 702 as well as drift region 706. As shown, there is no dielectric layer along the bottom of trenches 720, thus allowing the bottom region 727 to be in electrical contact with the underlying region. In one embodiment, similar considerations to those dictating the design and manufacture of the gate oxide of MOS transistors are applied in designing and forming insulating layer 708. For example, as in gate oxide of MOS transistors, the thickness of insulating layer 708 is determined by such factors as the voltage that insulating layer 708 is required to sustain and the extent to which the electric field in the trench diode is to be induced in drift region 706 (i.e., the extent of coupling through the insulating layer). The charge spreading in this embodiment is controlled by the optimization of the diode avalanche breakdown and the width of the depletion in the trenched diodes described more fully next.

As is well-known in this art, under reverse-bias conditions, the electric field is highest at the junction between regions 706 and 712 and linearly reduces in drift region 706 in the direction away from the junction between regions 706 and 712 at a rate dictated by the doping concentration of regions 712 and 714. It is also well known that the larger the area under the electric field curve (i.e., the lower the rate at which the electric field reduces), the greater is the breakdown voltage. During operation, the diodes embedded in trenches 702 are reverse biased and thus the electric field is highest at the diode junctions (e.g., at the junction between opposite conductivity type regions 725 and 723). Through insulating layer 708, the electric field in the trench diodes induces a corresponding electric field in drift region 706. The induced field is manifested in drift region 706 in the form of an up-swing spike and a general increase in the electric field curve in drift region 706. This increase in the electric field results in a larger area under the electric field curve, which in turn results in a higher breakdown voltage.

It can be seen that by using multiple diodes in trenches 702, multiple spikes can be induced along the depth of conduction regions in drift region 706. This results in an electric field curve which tapers down from its highest level at a far lower rate than in conventional structures. An almost trapezoidal-shaped area can thus be obtained under the electric field curve in drift region 706 as opposed to the conventional triangular shape. A far greater breakdown voltage can thus be obtained.

When structure 700 is biased in the conduction state, current passes through conduction region of drift region 706. By introducing diode trenches 702, the electric filed across the reverse-biased trenched diodes influences the charge distribution in adjacent drift region 706 such that a more uniform charge spreading is obtained in drift region 706. By spreading the charge more uniformly in drift regions 706, the silicon area taken up by drift region 706 is more efficiently used. Hence, for the same size drift region 706, the portion of the on-resistance attributable to the conduction region of drift region 706 is, in effect, reduced. This enables reducing the cell pitch for the same on-resistance. Accordingly, diode trenches 706 enable optimizing structure 700 to have higher breakdown voltage, lower on-resistance, and smaller cell pitch than can be achieved by conventional techniques.

Figure 8:
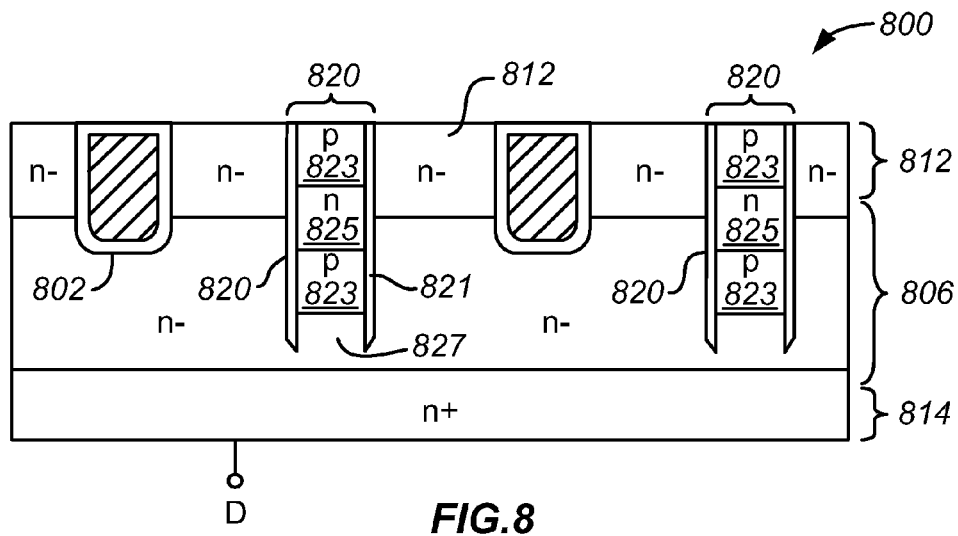

Other variations of accumulation-mode transistor 700 are possible. One such variation is shown in FIG. 8. In this embodiment, diode trenches 820 are disposed on either sides of gate trenches 802, extending well into drift region 806. Diode trenches 820 include one or more diode structures made up of opposite conductivity type regions 823 and 825 that form one or more pn junctions inside the trench. A thin dielectric layer 821 extending along the trench inner sidewalls insulates the diodes in the trench from drift region 806. In another variation of FIG. 8, not shown, one or more charge electrodes are formed in the gate trench below the gate electrode.

An exemplary method of forming the structure in FIG. 8 is as follows. An n-type epitaxial layer is formed over substrate 814. N-type region 812 is formed in the epitaxial layer by implanting dopants into the epitaxial layer. Depending on the desired doping concentration, n-type dopants may be implanted into the epitaxial layer so that channel regions 812 have a higher doping concentration than portion 806 of the epitaxial layer, or alternatively, p-type counter-dopants may be implanted into the epitaxial layer so that channel regions 812 have a lower doping concentration than portion 806 of the epitaxial layer. In another embodiment, regions 806 and 812 are formed by growing two n-type epitaxial layers having different doping concentrations. An exemplary set of process steps for forming the trenched diodes are described in the above-referenced commonly assigned patent application Ser. No. 10/821,796 titled "Schottky Diode Using Charge Balance Structure," filed Apr. 9, 2004, incorporated herein by reference in its entirety. The trenched-gate structures are formed using conventional techniques.

FIGS. 2-8 illustrate accumulation transistor embodiments in which various charge balancing structures are integrated in an optimum manner to improve the transistor blocking capability, on-resistance, and current density of the transistor. In FIGS. 9-14, the transistor embodiment with the trenched electrodes as shown in FIG. 3 is used to show various structural modifications and features each with its own distinct advantages. Although FIGS. 9-14 show these structural modifications in the context of the trenched electrodes transistor embodiment of FIG. 3, one or more of these structural modifications and features can be combined with one or more of the various charge balancing structures illustrated in FIGS. 2-8 depending on the desired goals and performance criteria.

Figure 9:
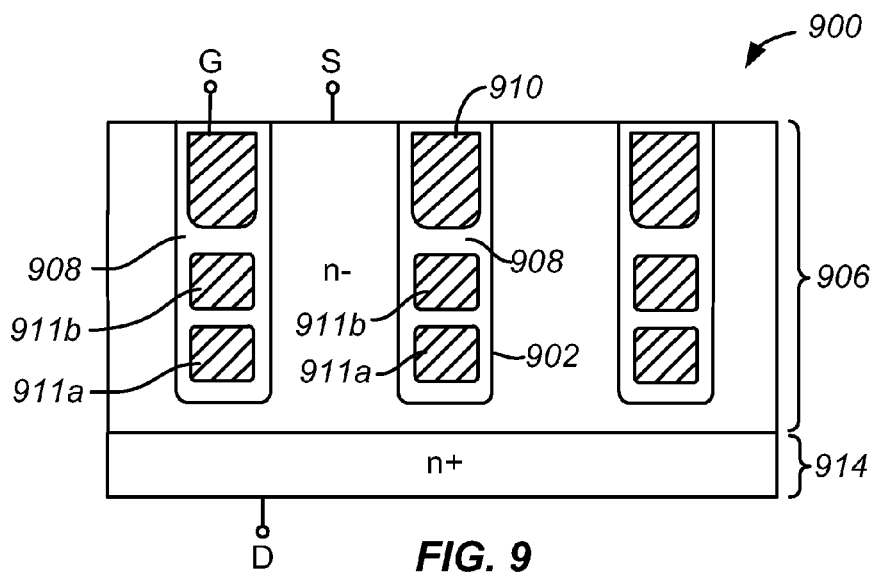
FIG. 9 shows a cross section view of a variation of the FIG. 3 embodiment wherein the channel regions and the drift region are merged (i.e., have the same doping concentration) in accordance with another embodiment of the invention.

In FIG. 9, the channel regions in which the conduction channel is formed (e.g., regions 312 in FIG. 3) are merged with the drift region to form a single region 906 in which trenches 902 are formed. Thus, drift region 906 extends from the top surface of the structure to substrate 914. Transistor 900 operates in the same manner as transistor 300 in FIG. 3. This embodiment has the advantage of a simpler manufacturing process because of elimination of the processing steps associated with forming the channel regions between the trenches. To maintain the same transistor current capability as the FIG. 3 structure, the doping concentration in region 906 needs to be increased. This in turn reduces the transistor voltage blocking capability. But, due to the presence of the charge balancing trenched electrodes, the increased doping concentration does not result in as much of a reduction in the transistor blocking capability. It is to be understood that the channel regions in the other embodiments illustrated in FIGS. 4-8 may similarly be merged with the drift region.

Figure 10:
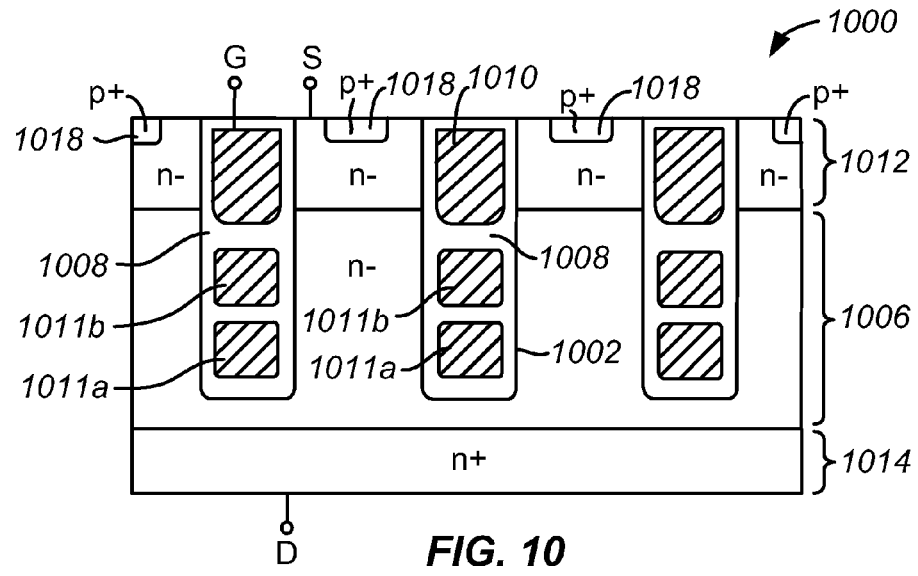
FIGS. 10 and 11 show cross section views of two variations of the FIG. 3 embodiment wherein heavily doped opposite conductivity-type regions are formed in the channel regions in accordance with other embodiments of the invention.
Figure 11:
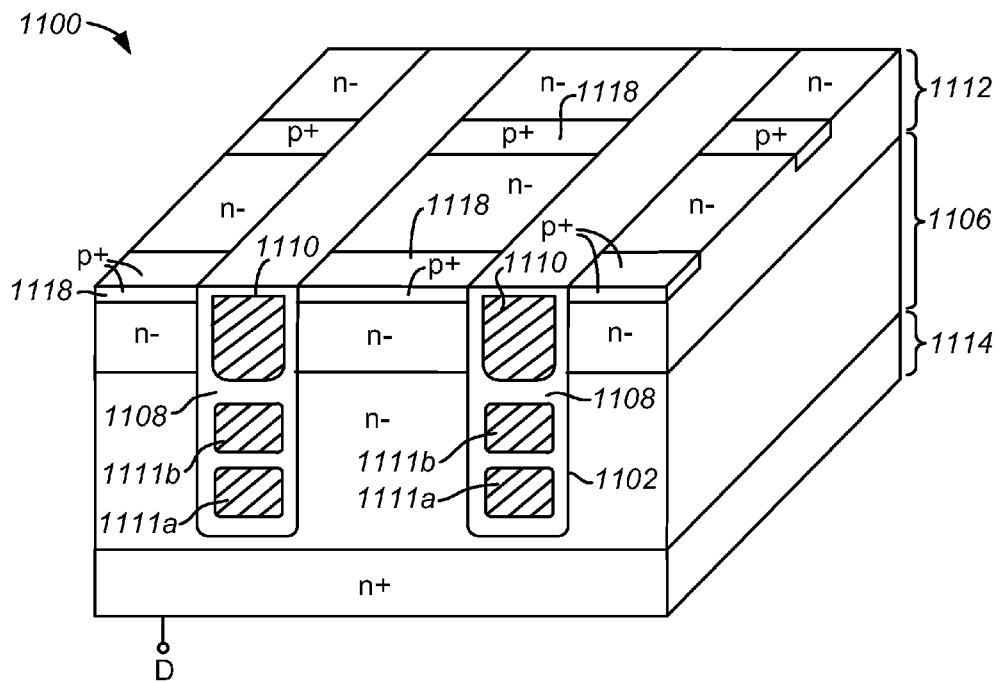

In FIG. 10, heavily doped p-type regions 1018 are formed in channel regions 1012 between trenches 1002. P-type regions 1018 minimize the area of channel regions 1012 and reduce device leakage. P-type regions 1018 also allow for p+ contact which improve hole current flow in avalanche and improve device robustness. Each of p+ regions 1018 may be a single continuous region extending the length of the mesa (i.e., in the dimension perpendicular to the page) between trenches, or may be one of multiple p+ regions formed at intervals along the length of the mesa between the trenches. FIG. 11 shows a three-dimensional view of a variation of the structure in FIG. 10. As shown, p+ regions 1118 laterally extend to abut the trenches between which they are located. However, p+ regions 1118 are formed at intervals along the length of the mesa so that channel regions 1112 can be contacted along their top surface in order to accommodate current flow when the transistor is turned on. An advantage of extending the p+ region between adjacent trenches as compared to FIG. 10 wherein p+ regions 1018 are laterally spaced from the trenches is that the alignment tolerance required by the spacing between the p+ regions and the edge of trenches in FIG. 10 is eliminated thus resulting in a smaller cell pitch. The p+ regions can be used in a similar manner in any one of the accumulation transistors described herein.

Figure 12:
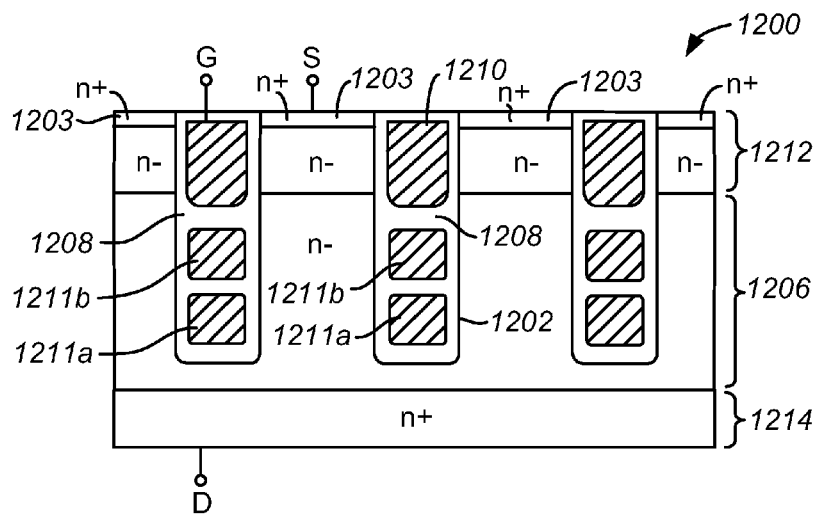
FIGS. 12 and 13 show cross section views of two variations of the FIG. 3 embodiment wherein heavily doped same conductivity-type regions are formed in the channel regions in accordance with other embodiments of the invention.
Figure 13:
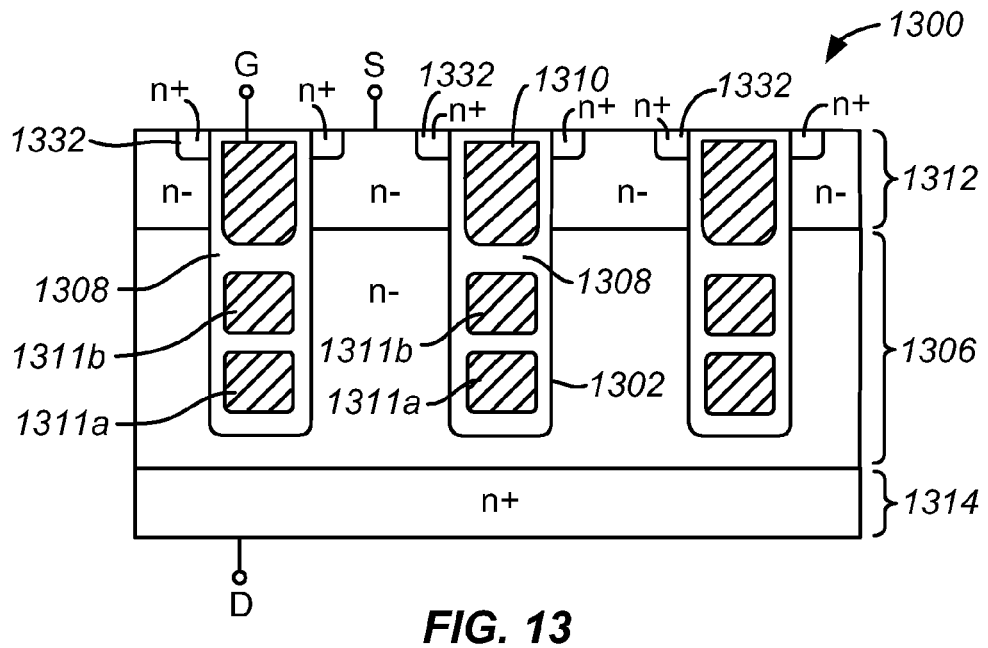
Figure 14:
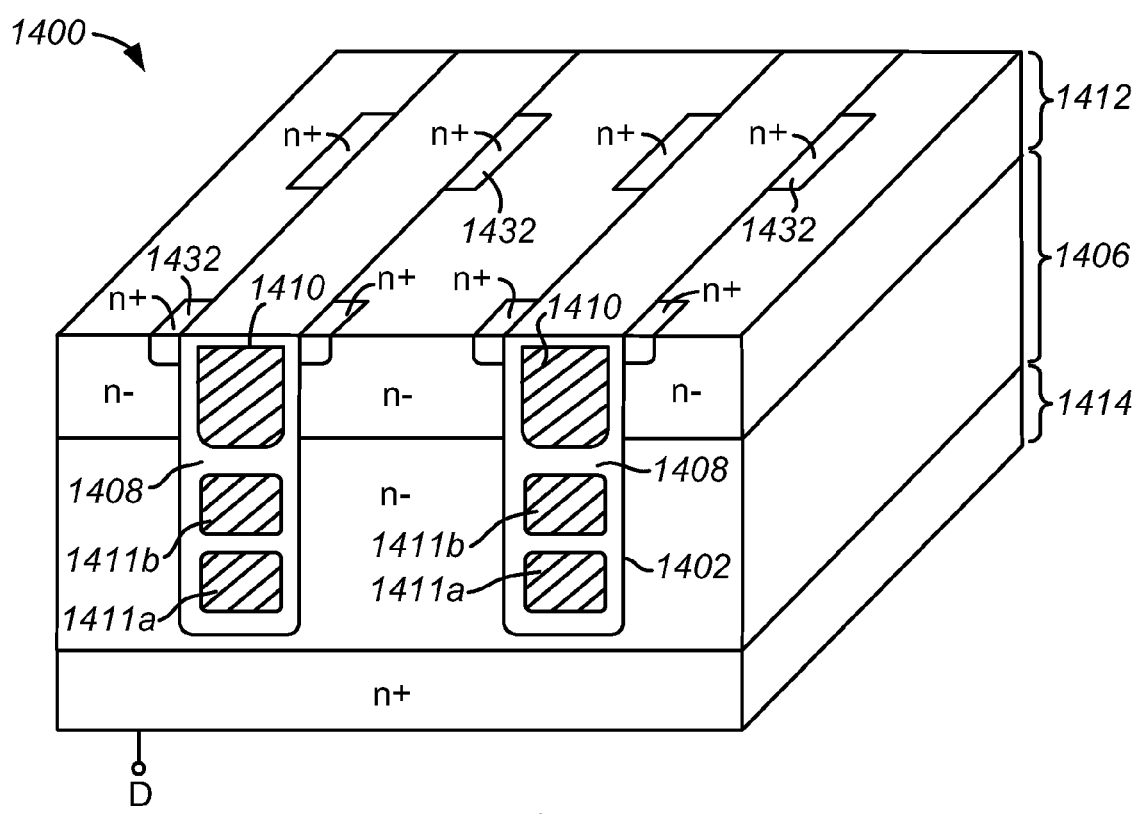
FIG. 14 shows a three dimensional view of the FIG. 13 embodiment.

In FIG. 12, n-type channel regions 1212 include more heavily doped shallow n+ source regions 1203. Heavily doped source regions 1203 result in better contact with the overlying source electrode, and thus reduce the contact resistance. Heavily doped source regions 1203 can extend along the top surface of channel regions 1212 between trenches as shown in FIG. 12, or can alternatively be formed as two regions adjacent trench sidewalls along the top edge of channel regions 1212 as shown in FIG. 13. An advantage of this approach is the source metal contacting lightly doped channel regions 1212 forms a Schottky contact therebetween which helps minimize leakage current. FIG. 14 shows a 3-dimensional view of the structure illustrated in FIG. 13. As shown, n+ source regions 1432 are formed at intervals along the length of the mesa between trenches in channel regions 1412. N+ regions 1432 may alternatively be a single continuous region extending the length of the mesa between trenches. The heavily doped source regions as illustrated in FIGS. 12-14 can be used in the same manner in any one of the accumulation transistors described herein. The heavily doped regions in FIGS. 10-14 can be formed in respective channel regions using known masking and implanting techniques.

Figure 15:
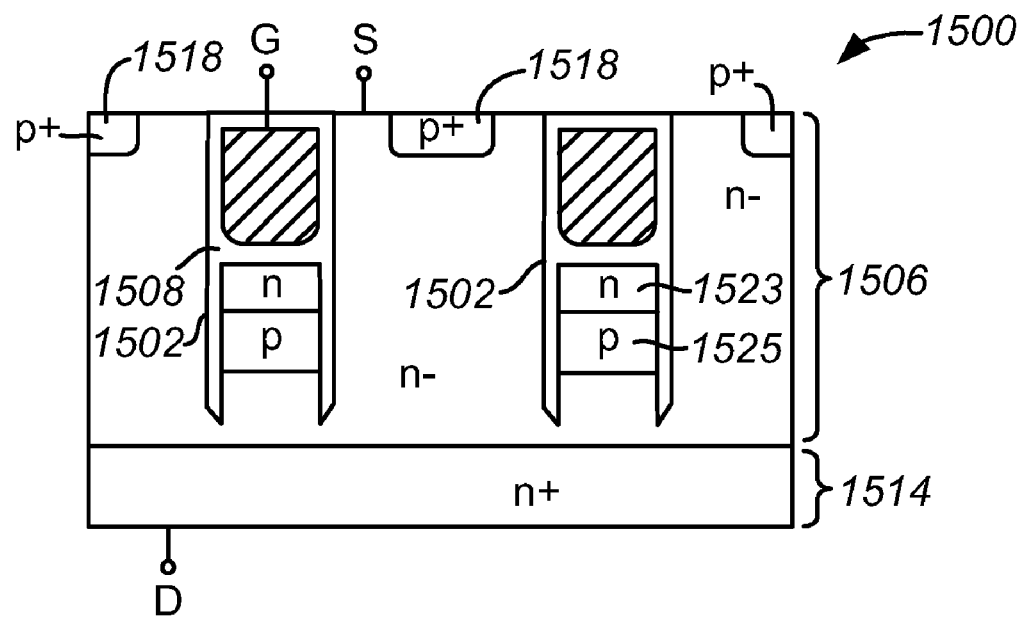
FIG. 15 shows a cross section view of a variation of the FIG. 7 embodiment wherein the channel regions are merged with the drift region (i.e., have the same doping concentration), and heavily doped opposite conductivity-type regions are formed in the channel regions in accordance with another embodiment of the invention.
Figure 16:
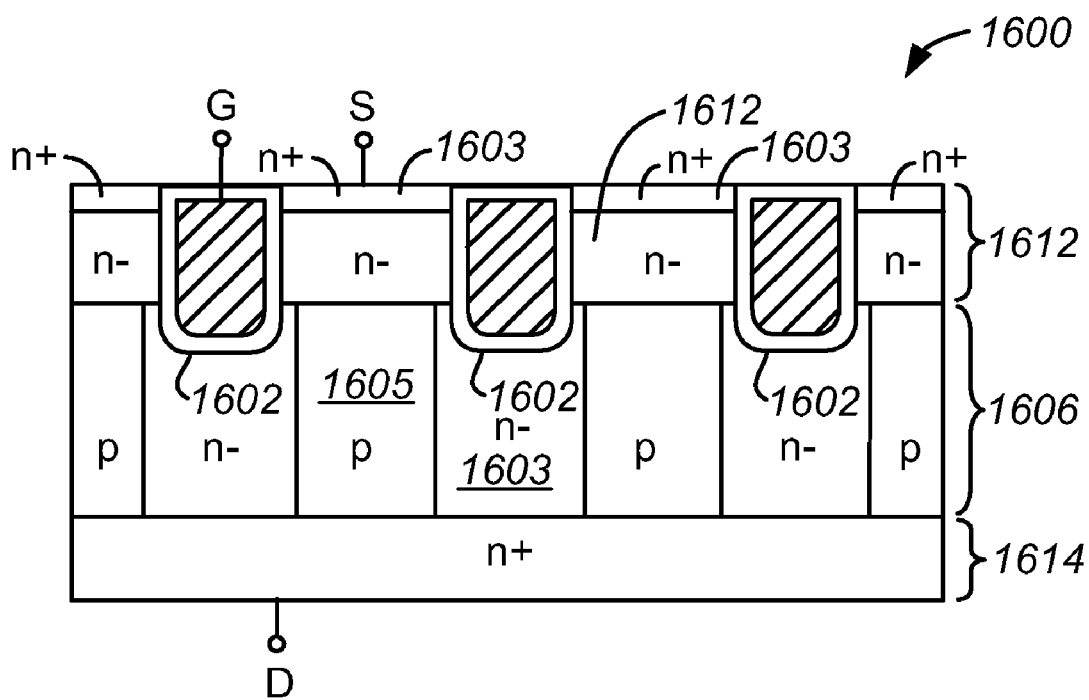
FIG. 16 shows a cross section view of a variation of the FIG. 2 embodiment wherein heavily doped same conductivity-type regions are formed in the channel regions in accordance with another embodiment of the invention.

It is to be understood that any of the charge balancing structures illustrated in FIGS. 2-8 may be combined with one or more of the structural variations and features illustrated in FIGS. 9-14 as desired. For example, FIG. 15 shows the charge balancing structure illustrated in FIG. 7 in combination with the highly-doped p+ regions, wherein the channel regions are merged with the drift region to form a single silicon region 1506 in which the trenches are formed. FIG. 16 shows another example wherein the charge balancing structure illustrated in FIG. 2 is combined with the highly doped n+ regions.

Figure 17:
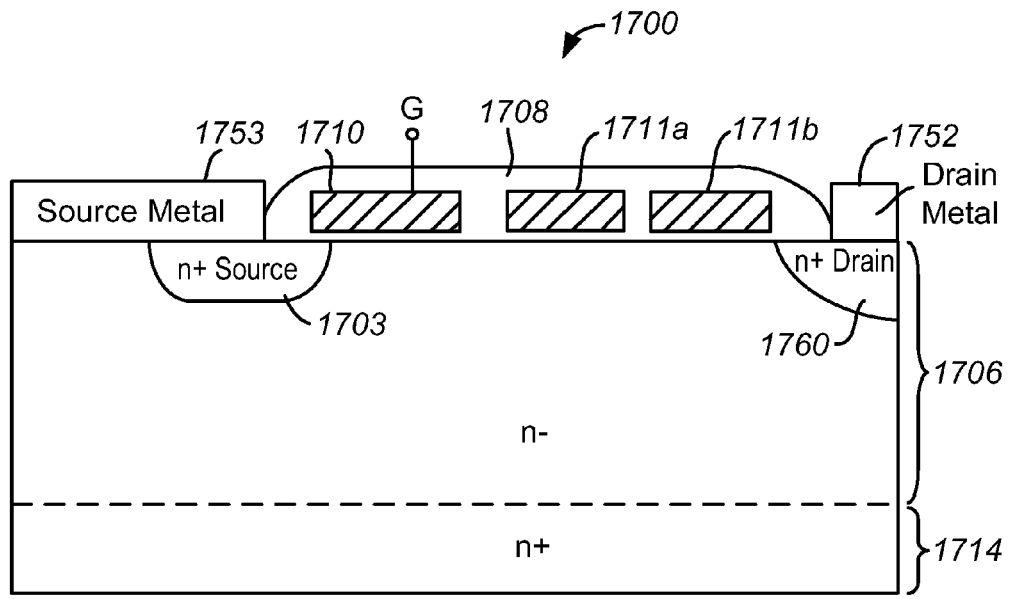
FIG. 17 shows a cross section view of an exemplary planar-gate accumulation-mode lateral field effect transistor with charge balancing electrodes in accordance with another embodiment of the invention.
Figure 18A:
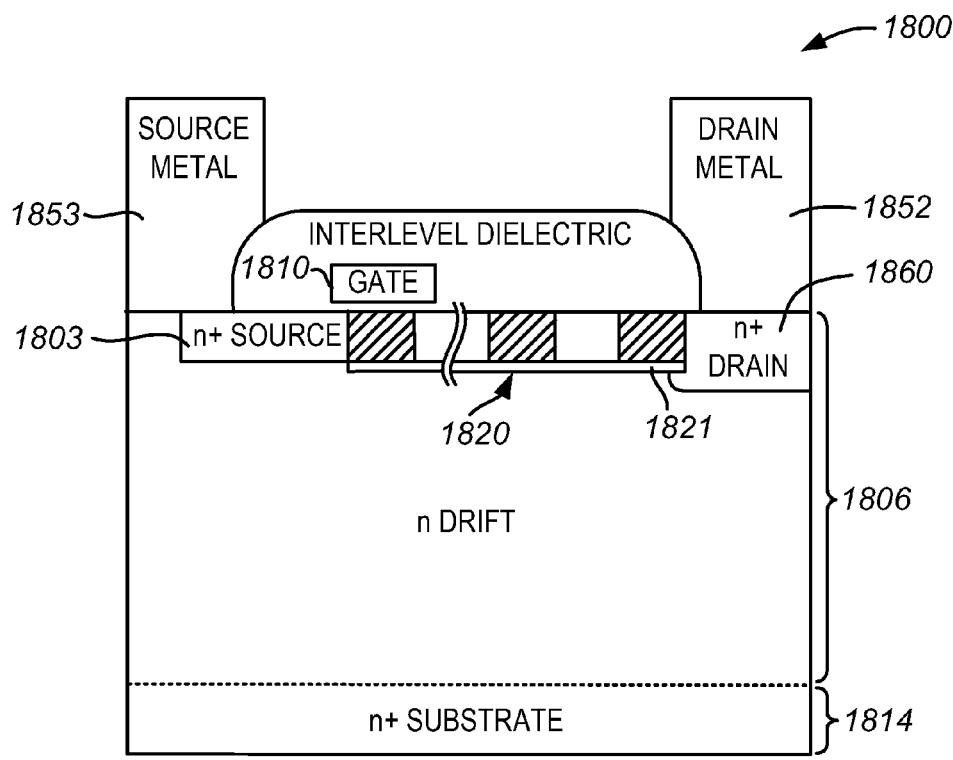
FIG. 18A shows a cross section view of an exemplary planar-gate accumulation-mode lateral field effect transistor with trenched diodes in accordance with another embodiment of the invention.
Figure 18B:
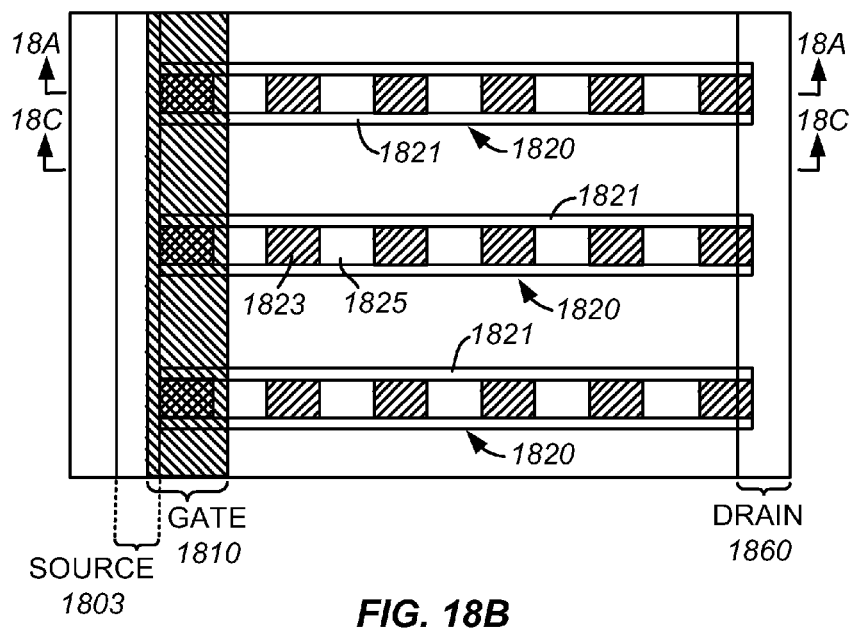
FIG. 18B shows a top layout view of the embodiment shown in FIG. 18A.
Figure 18C:
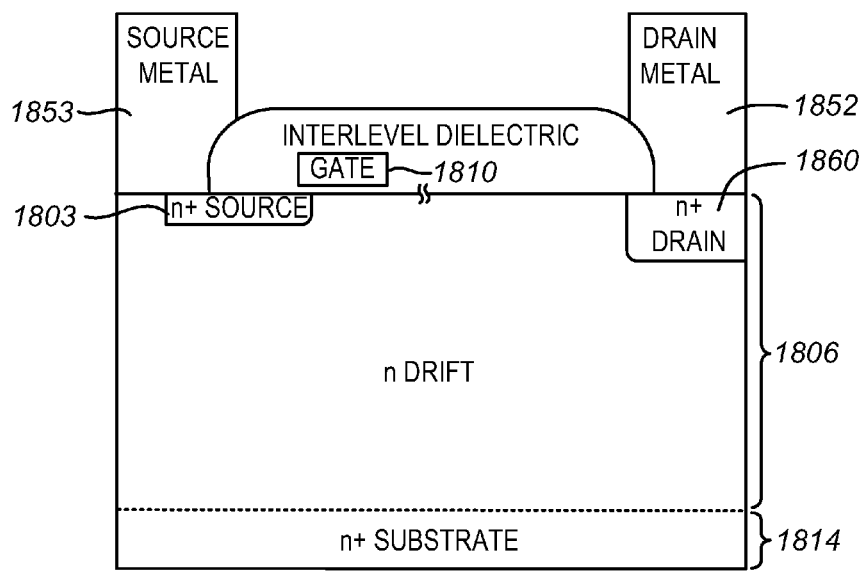
FIG. 18C shows a cross section view along 18C-18C line in FIG. 18B.

Also, variations on exemplary vertical MOS-gated accumulation transistors have been discussed to illustrate the various features and advantages of the present invention. One of skill in the art appreciates that these can be implemented in other types of devices including planar-gate vertical transistors, planar-gate lateral transistors, trenched-gate lateral transistors, diodes, bipolar transistors and the like. FIGS. 17 and 18A-18C show few examples of such devices. In FIG. 17, laterally-positioned electrodes 1711a and 1711b are integrated in a planar-gate accumulation-mode lateral transistor 1700. In FIGS. 18A-18C, laterally-extending diode trenches 1820 are integrated in a planar-gate accumulation-mode lateral transistor 1800. FIG. 18B shows a top view of transistor 1800. FIGS. 18A and 18C respectively show the cross section views along lines 18A-18A and 18C-18C in FIG. 18B. In the FIGS. 17 and 18A-18C embodiments, as in the previous embodiment, the charge balance electrodes and diodes extend parallel to the current flow.

Figure 19:
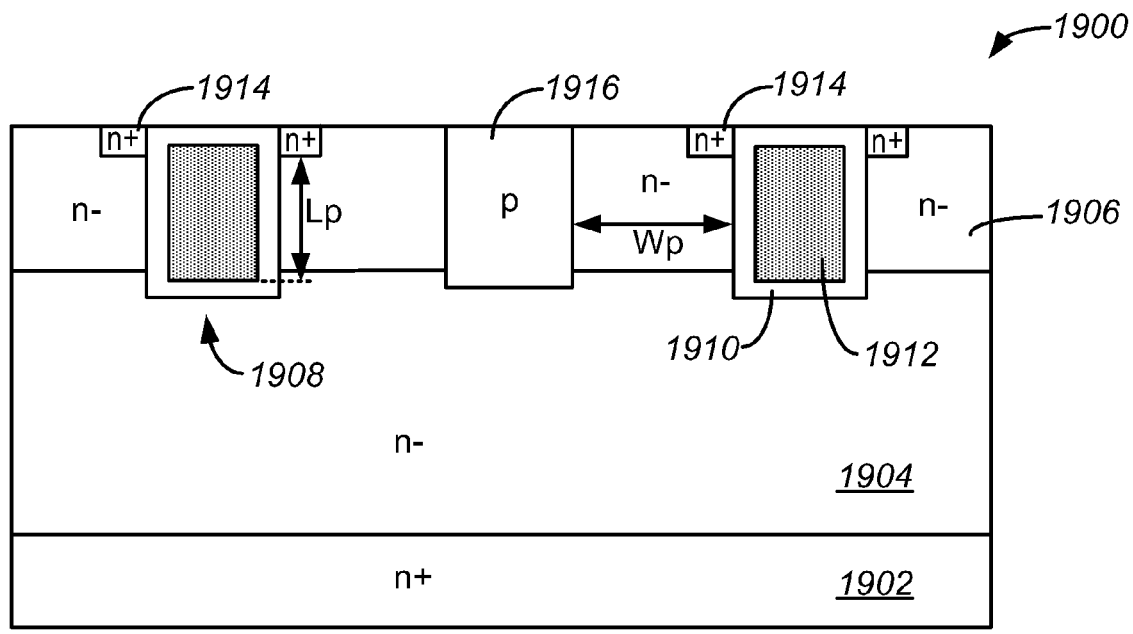
FIG. 19 shows a cross-section view of a trenched-gate accumulation FET in accordance with an embodiment of the present invention.

FIG. 19 shows a cross-section view of a trenched-gate accumulation FET 1900 in accordance with an embodiment of the present invention. FET 1900 includes an n-type substrate 1902, an n-type drift region 1904, and an n-type mesa region 1906. Gate trenches 1908 extend through mesa region 1906 and terminate in drift region 1904. Each gate trench 1908 is lined with a dielectric layer 1910 along its sidewalls and bottom, and includes a recessed gate 1912. N-type source regions 1914 flank each side of trenches 1908 as shown.

A p-type body region 1916 extends into mesa region 1906 between each pair of gate trenches 1908. Body regions 1916 form a p-n junction with mesa region 1906. The p-n junction results in a stronger pinch-off for improved blocking and Rdson. The amount of pinch-off, determined by the voltage and charge in the pinched-off region, influences the blocking characteristics. Also, the ratio of the pinched channel length (Lp in FIG. 19) to the pinched channel width (Wp in FIG. 19) needs to be kept as high as possible (preferably >1) for good blocking capability. Note that the pinched channel length Lp is the spacing between the bottom of region 1914 and the bottom of the shallower one of the gate 1912 and body region 1916.

Figure 23:
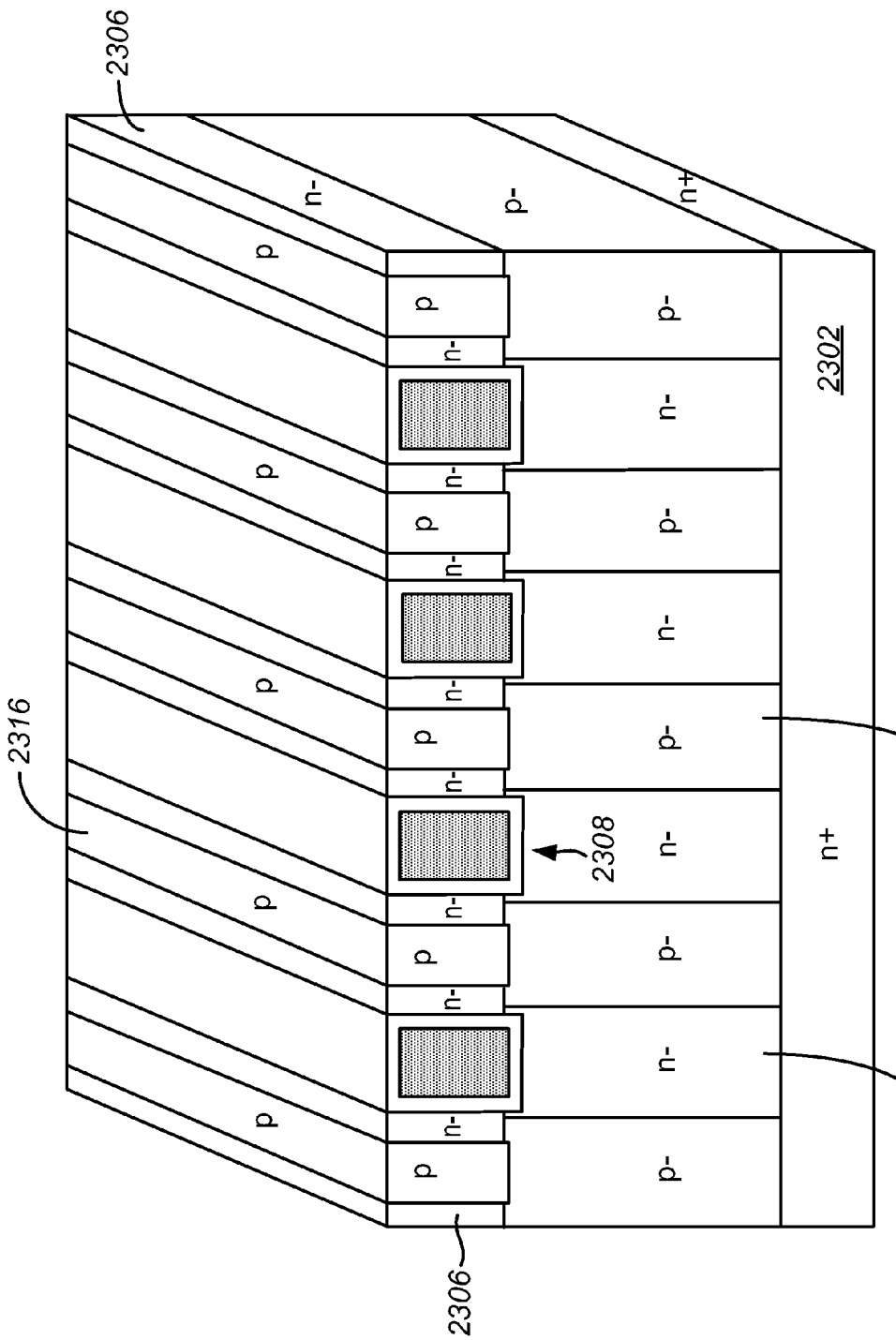
FIG. 23 shows an isometric view of a FET with charge balance structure wherein continuous stripes of body regions are used, in accordance with another embodiment of the invention.

In FIG. 19, body regions 1916 extend deeper than mesa region 1906, however, in another embodiment, a shallower body region (extending to a shallow depth within region 1906 or to a depth just above the lower surface of mesa region 1906) may be formed. But, a deeper body region, as shown, is advantageous since the built-in potential of the p-n junction (Vbi,max value is Eg/q, ~1.1 V) also pinches the channel thus resulting in better blocking capability. In other embodiments, each body region 1916 is advantageously formed as a continuous stripe along the dimension perpendicular to the page. Using a continuous stripe, as opposed to multiple body regions with gaps therebetween, prevents the possibility of leakage current to flow through the gaps. FIG. 23 more clearly illustrates an implementation of continuous body regions 2316 in one embodiment of the invention. In an alternate variation, the continuous body region is broken up into multiple regions, however the gaps between the body regions needs to be kept small enough so that the gaps can be fully depleted by the built-in potential. For cellular designs, each body region 1916 (FIG. 19) is enclosed within the cell such that it helps in pinching off the entire channel.

Incorporation of the body regions in the accumulation FET, in accordance with the different embodiments of the invention, results in a net built-in voltage which is about four times greater than that without the body regions. Hence the charge (Q) in the channel can be kept higher to obtain better on-resistance with high blocking capability. Since the accumulation layer mobility is higher than inversion layer mobility, the channel resistance is lower for accumulation FETs. This is particularly true for silicon carbide (SiC) based devices. Also, the pinched regions (i.e., the portions of mesa region 1906 between body region 1916 and its adjacent gate trenches 1908) can carry current, particularly at higher current densities, in parallel to the channel regions. This further lowers the Rdson thus improving device power handling capability and its efficiency. Also, due to higher transconductance and lower Vth, the accumulation FET in accordance with the invention is particularly attractive for low gate voltage, high current applications.

Conventional accumulation FETs rely solely on MOS depletion and hence are sensitive to oxide charge variations and work function differences. However, in the accumulation FET of the present invention, majority of the blocking is provided by the p-n junction, and thus the FET device is less sensitive to oxide charges. The threshold voltage (Vth) of the accumulation FET is primarily controlled by Wp (FIG. 19) and the doping concentration of mesa region 1906. In contrast, for conventional enhancement mode FETs, Vth is controlled by the Tox, Qox, p-well dose/drive, source junction depth (Xjs), and p-well junction depth (Xjw). Therefore, the Vth of accumulation FET of the present invention could be better controlled, particularly for low Vth devices.

Figure 20:
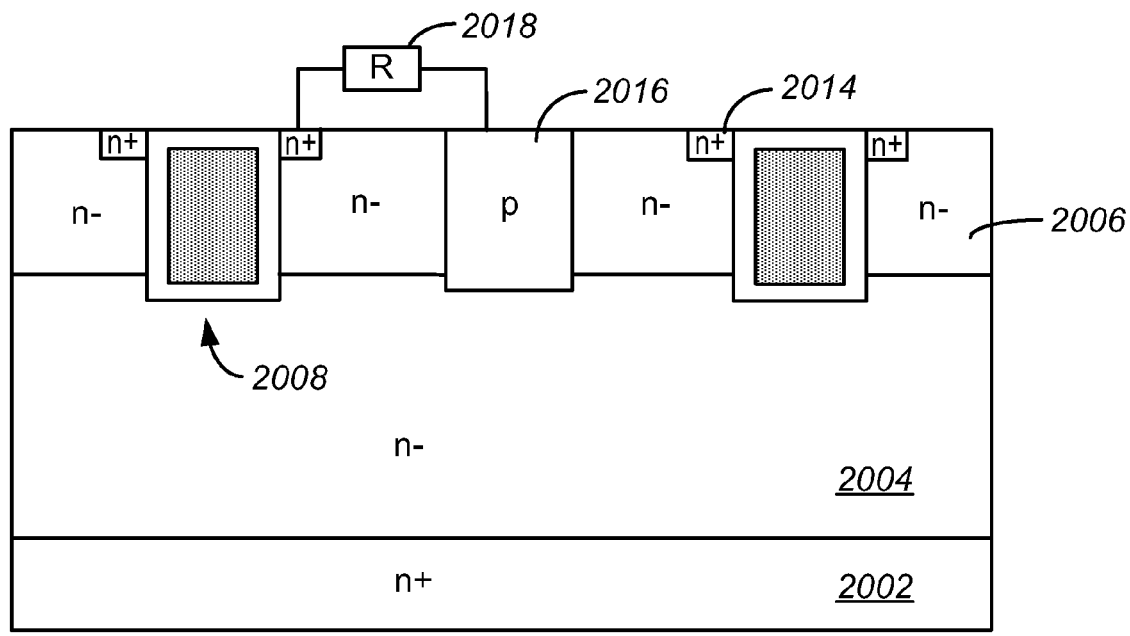
FIG. 20 shows a variation of the FIG. 19 FET wherein a resistor 2718 is coupled between the body and source regions.
Figure 21:
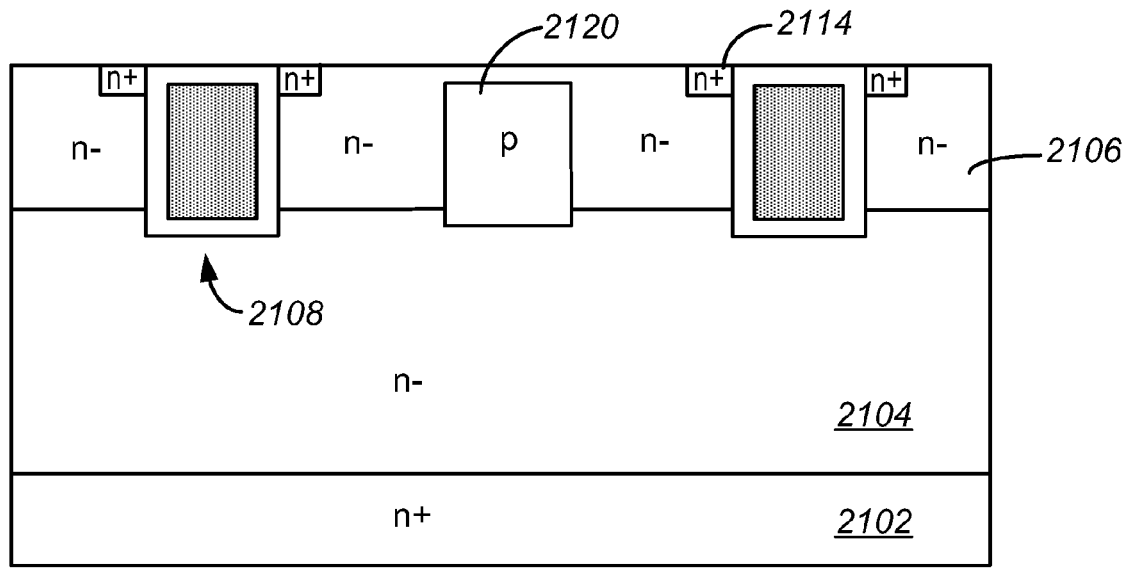
FIG. 21 show yet another variation of the FIG. 19 FET wherein the body regions are buried in silicon.

The p-n diode formed between body region 1916 and mesa region 1906 injects minority carriers when forward biased and thus the associated reverse recovery may be undesirable in certain applications. This undesirable effect can be eliminated or substantially minimized in a number of ways. In a first approach, the doping concentration of body region 1916 is reduced. In a second approach illustrated in FIG. 20, a resistor 2018 is coupled between body regions 2016 and source regions 2014. Resistor 2018 drastically reduces the diode current, but still keeps body regions 2016 at ground potential during normal operation. The capacitance associated with the p-n junction needs to be charged through resistor 2018 during switching from on to off state. Thus, the resistance value of resistor 2018 should be carefully chosen such that the switching is not adversely affected while the injection of minority carriers is minimized. A third approach is to float body regions 2016 either by not biasing them to any potential, or as illustrated in FIG. 21, burying them in silicon. The latter approach completely eliminates the body diode problem.

Figure 22:
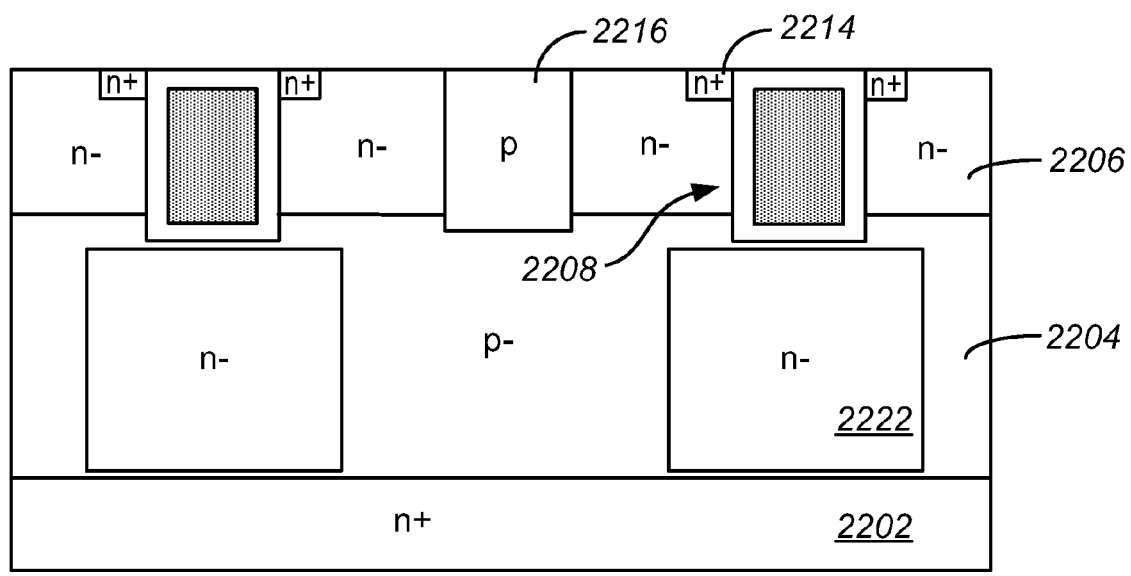
FIG. 22 shows an exemplary implementation of the FIG. 19 FET in a multi-pillar charge balance structure.

FIG. 22 shows an exemplary implementation of an embodiment of the invention in a multi-pillar charge balance structure. In general, integrating super junction structures, such as that in FIG. 22, reduces the Rdson drastically. FIG. 23 shows an isometric view of an exemplary stripe geometry device with continuous body stripes 2316 and multi-pillar charge balance structure.

The table below compares simulation results for a 30V accumulation mode FET in accordance with an embodiment of the invention and a 30V conventional enhancement mode FET. No charge balance structure was used in either device.

Simulation parameters used include: trench width=mesa width=0.5 μm; Tox=250 Å; trench depth=1 μm; p-well/p-body depth=0.8 μm; Epi thickness=2 μm; Epi doping=2×$10^{16}$/cm$^3$; doping of mesa region=1×$10^{13}$/cm$^3$; BV is measured at J=1 mA/cm$^2$; Rdson at Vg=5V, J=100 A/cm$^2$; Vth at J=10 mA/cm$^2$; and Qgt at Vg=5V.

|  | Rsp; @ Vg = 5 V, 100 A/cm$^2$ (μΩ-cm$^2$) | Vth @ 10 mA/cm$^2$ (V) | BV @ 1 mA/cm$^2$ (V) | Body diode Irrm (A) | Gm @ Vdd = 2 V, J = 100 A/cm$^2$ (S/cm$^2$) | Qgtot @ 5 V (nC/cm$^2$) |
|---|---|---|---|---|---|---|
| Accumulation FET | 47.2 | 0.74 | 32.2 | 1.4 | 2427 | 1620 |
| Enhancement FET | 51.1 | 0.74 | 34.7 | 3.7 | 1676 | 1811 |

As can be seen, the accumulation FET has lower Rsp, Qg and Irrm, and a much higher transconductance (Gm) than the conventional enhancement FET. Also, simulation results showed that the electric field lines in the drift region of the accumulation FET had little crowding, were equally spaced and substantially flat, and as such similar blocking capability as the conventional FET was obtained.

Known process techniques can be used to form the accumulation FET of the present invention. For example, the manufacturing methods described above may be used and modified in one of a number of ways to obtain the structures shown in FIGS. 19-23. Body regions 1916 (FIG. 19) can be formed in a number of ways. In a first approach, multiple implants of p-type dopants into mesa region 1906 are carried out using varying energies to form body regions 1916 with a relatively uniform doping concentration and a rectangular profile with minimal lateral bulge. In a second approach, a trench may be formed through mesa regions 1906 between adjacent gate trenches 1908, and then selectively filled with p-type silicon using well know selective epitaxial growth (SEG) techniques. The latter approach provides good aspect ratio with a rectangular shape, and uniform doping concentration. These two techniques can be modified, as known in this art, to form the buried body regions 2120 in FIG. 21. Resistor 2018 in FIG. 20 may be formed in a number of ways. For example, a polysilicon thin film resistor may be used or alternatively the high metal contact resistance to lightly doped p-type body may be used as the resistor.

FIGS. 19-23 show the gate trenches terminating in the drift region, however, the gate trenches can also extend through the drift region and terminate within the substrate. While FIG. 23 shows an open cell geometry, the various embodiments of the invention may be implemented in any closed cell geometry, including hexagonal and square shape geometries. Also, while the various embodiments illustrated in FIGS. 19-23 are implemented in conventional silicon, these embodiments and their obvious variants can also be implemented in silicon carbide, gallium arsenide, gallium nitride, diamond or other semiconductor materials.

The cross-section views of the various embodiments described herein may not be to scale, and as such are not intended to limit the possible variations in the layout design of the corresponding structures. Also, the various transistors can be formed in stripe or cellular architecture including hexagonal or square shaped transistor cells Although a number of specific embodiments are shown and described above, embodiments of the invention are not limited thereto. For example, it is understood that the doping polarities of the structures shown and described could be reversed and/or the doping concentrations of the various elements could be altered without departing from the invention. As another example, the various exemplary accumulation-mode vertical transistors described above have the trenches terminating in the drift regions, but they can also terminate in the more heavily doped substrate. As yet another example, the above-described embodiments are formed in silicon, but they could also be formed in silicon carbide, GaAs or other types of semiconductor materials. Also, the features of one or more embodiments of the invention may be combined with one or more features of other embodiments of the invention without departing from the scope of the invention.

Therefore, the scope of the present invention should be determined not with reference to the above description but should, instead, be determined with reference to the appended claim, along with their full scope of equivalents.

What is claimed is:

1. An accumulation-mode field effect transistor comprising:
   a drift region of a first conductivity type;
   channel regions of the first conductivity type over and in contact with the drift region;
   gate trenches having sidewalls abutting the channel regions, the gate trenches extending into the drift region; and
   a first plurality of silicon regions of a second conductivity type forming P-N junctions with the channel regions along vertical walls of the first plurality of silicon regions, the first plurality of silicon regions extending into the drift region so as to form P-N junctions with the drift region along bottoms of the first plurality of silicon regions, each silicon region of the first plurality of silicon regions having a top surface that is recessed relative to a top surface of an adjacent one of the channel regions.

2. The accumulation-mode field effect transistor of claim 1 wherein conduction channels are formed in the channel regions along the sidewalls of the gate trenches when the accumulation-mode field effect transistor is in an on state.

3. The accumulation-mode field effect transistor of claim 1 wherein when the transistor is in an on state, a current flows through the channel regions and the drift region but not through the first plurality of silicon regions.

4. The accumulation-mode field effect transistor of claim 1 further comprising:
   a substrate of the first conductivity type; and
   an epitaxial layer of the first conductivity type over the substrate, the epitaxial layer having a lower doping concentration than the substrate,
   wherein the channel regions, the first plurality of silicon regions, and the gate trenches are formed in the epitaxial layer, and a portion of the epitaxial layer bounded by the substrate and bottom surfaces of the channel regions, gate trenches, and the first plurality of silicon regions forms the drift region.

5. The accumulation-mode field effect transistor of claim 1 further comprising a second plurality of silicon regions of the first conductivity type in the channel regions, the second plurality of silicon regions flanking the gate trenches, the second plurality of silicon regions having a higher doping concentration than that of the channel regions.

6. The accumulation-mode field effect transistor of claim 1 wherein the gate trenches and the first plurality of silicon regions are parallel-extending continuous stripes.

7. The accumulation-mode field effect transistor of claim 1 wherein the first plurality of silicon regions are not directly biased to a potential.

8. The accumulation-mode field effect transistor of claim 1 wherein the drift region includes alternating columns of first and second conductivity type silicon, and when the accumulation-mode field effect transistor is in an on state, a current flows through the columns of first conductivity type but not through the columns of the second conductivity type.

9. The accumulation-mode field effect transistor of claim 1 wherein each gate trench includes a gate electrode therein, the gate electrode being insulated from the channel regions by a gate dielectric.

10. The accumulation-mode field effect transistor of claim 1 wherein a doping concentration of the first conductivity type in the drift region is same as a doping concentration of the first conductivity type in the channel regions.

11. An accumulation-mode field effect transistor comprising:
a drift region of a first conductivity type;
a channel region of the first conductivity type over and in contact with the drift region;
a gate trench having a sidewall abutting the channel region, the gate trench extending into the drift region; and
a silicon region of a second conductivity type forming a P-N junction with the channel region along a vertical wall of the silicon region, the silicon region extending into the drift region so as to form a P-N junction with the drift region along a bottom of the silicon region, the silicon region having a top surface that is recessed relative to a top surface of the channel region.

12. The accumulation-mode field effect transistor of claim 11 wherein a conduction channel is formed in the channel region along the sidewall of the gate trench when the accumulation-mode field effect transistor is in the on state.

13. The accumulation-mode field effect transistor of claim 11 wherein when the transistor is in an on state, a current flows through the channel region and the drift region but not through the silicon region.

14. The accumulation-mode field effect transistor of claim 11 further comprising:
a substrate of the first conductivity type; and
an epitaxial layer of the first conductivity type over the substrate, the epitaxial layer having a lower doping concentration than the substrate,
wherein the channel region, the silicon region, and the gate trench are formed in the epitaxial layer, and a portion of the epitaxial layer bounded by the substrate and bottom surfaces of the channel region, the gate trench, and the silicon region forms the drift region.

15. The accumulation-mode field effect transistor of claim 11 further comprising a silicon region of the first conductivity type in the channel region, the silicon region of the first conductivity type flanking the gate trench, the silicon region of the first conductivity type having a higher doping concentration than that of the channel region.

16. The accumulation-mode field effect transistor of claim 11 wherein the gate trench and the silicon region are parallel-extending continuous stripes.

17. The accumulation-mode field effect transistor of claim 11 wherein the silicon region is not directly biased to a potential.

18. The accumulation-mode field effect transistor of claim 11 wherein the drift region includes a column of the first conductivity type and a column of the second conductivity type, and when the accumulation-mode field effect transistor is in an on state, a current flows through the column of the first conductivity type but not through the column of the second conductivity type.

19. The accumulation-mode field effect transistor of claim 11 wherein the gate trench includes a gate electrode therein, the gate electrode being insulated from the channel region by a gate dielectric.

20. The accumulation-mode field effect transistor of claim 11 wherein a doping concentration of the first conductivity type in the drift region is same as a doping concentration of the first conductivity type in the channel region.

* * * * *